United States Patent
Lebens et al.

(10) Patent No.: US 9,005,744 B2
(45) Date of Patent: Apr. 14, 2015

(54) CONDUCTIVE MICRO-WIRE STRUCTURE

(71) Applicants: John Andrew Lebens, Rush, NY (US); David Paul Trauernicht, Rochester, NY (US); Yongcai Wang, Rochester, NY (US); Ronald Steven Cok, Rochester, NY (US)

(72) Inventors: John Andrew Lebens, Rush, NY (US); David Paul Trauernicht, Rochester, NY (US); Yongcai Wang, Rochester, NY (US); Ronald Steven Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 110 days.

(21) Appl. No.: 13/751,464

(22) Filed: Jan. 28, 2013

(65) Prior Publication Data
US 2014/0209359 A1    Jul. 31, 2014

(51) Int. Cl.
*B32B 27/32*   (2006.01)
*G11B 11/105*  (2006.01)
*H05K 1/00*    (2006.01)
*H05K 1/02*    (2006.01)

(52) U.S. Cl.
CPC ........................................ *H05K 1/02* (2013.01)

(58) Field of Classification Search
None
See application file for complete search history.

(56) References Cited

U.S. PATENT DOCUMENTS

| | | |
|---|---|---|
| 8,179,381 B2 | 5/2012 | Frey et al. |
| 8,828,503 B1 * | 9/2014 | Yau et al. ............ 427/557 |
| 2009/0165296 A1 | 7/2009 | Carmi |
| 2010/0026664 A1 | 2/2010 | Geaghan |
| 2010/0302204 A1 | 12/2010 | Miyayama et al. |
| 2011/0007011 A1 | 1/2011 | Mozdzyn |
| 2011/0099805 A1 | 5/2011 | Lee |
| 2011/0102370 A1 | 5/2011 | Kono et al. |
| 2011/0289771 A1 | 12/2011 | Kuriki |
| 2011/0291966 A1 | 12/2011 | Takao et al. |
| 2012/0031746 A1 | 2/2012 | Hwang et al. |
| 2012/0162116 A1 | 6/2012 | Philipp |
| 2012/0327569 A1 | 12/2012 | Park et al. |
| 2013/0222328 A1 * | 8/2013 | Cok et al. ............ 345/174 |

FOREIGN PATENT DOCUMENTS

CN     102063951     5/2011

OTHER PUBLICATIONS

U.S. Appl. No. 13/571,704, filed Aug. 10, 2012, Cok.
U.S. Appl. No. 13/406,649, filed Feb. 28, 2012, Cok.

* cited by examiner

*Primary Examiner* — Sheeba Ahmed
(74) *Attorney, Agent, or Firm* — Raymond L. Owens

(57) ABSTRACT

A conductive micro-wire structure includes a substrate. A plurality of spaced-apart electrically connected micro-wires is formed on or in the substrate forming the conductive micro-wire structure. The conductive micro-wire structure has a transparency of less than 75% and greater than 0%.

27 Claims, 24 Drawing Sheets

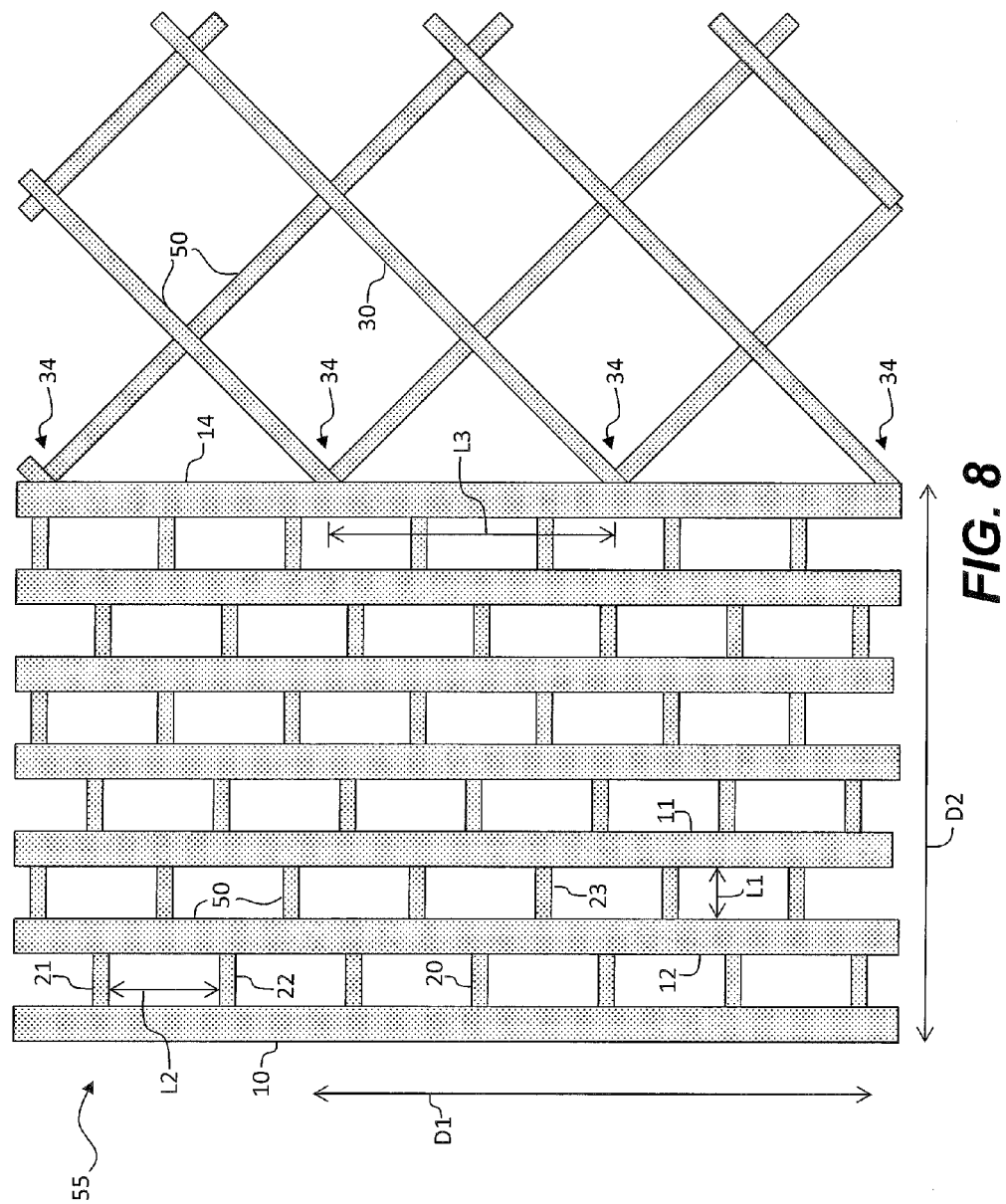

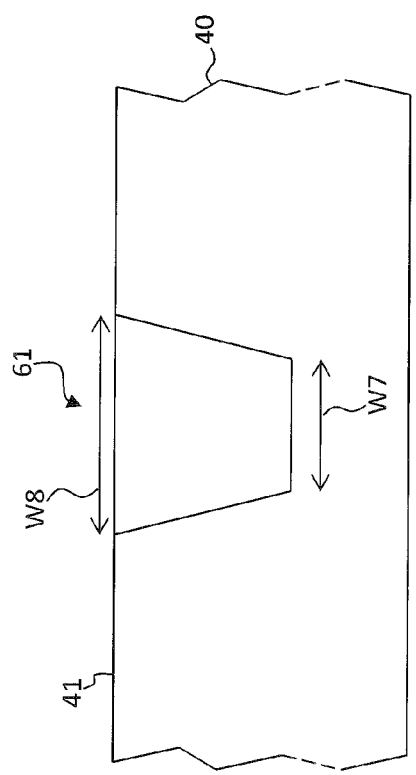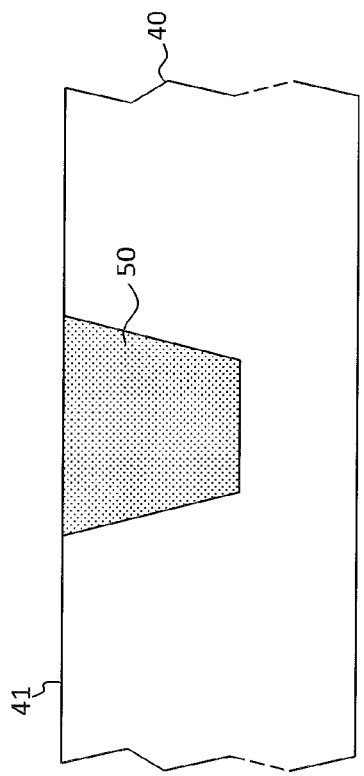
FIG. 18
FIG. 19

CONDUCTIVE MICRO-WIRE STRUCTURE

CROSS REFERENCE TO RELATED APPLICATIONS

Reference is made to commonly assigned, co-pending U.S. patent application Ser. No. 13/751,430 filed Jan. 28, 2013, entitled "Large-Current Micro-Wire Pattern" by Lebens et al; U.S. patent application Ser. No. 13/751,443 filed Jan. 28, 2013, entitled "Micro-Wire Pattern for Electrode Connection" by Lebens et al; and U.S. patent application Ser. No. 13/751,450 filed Jan. 28, 2013, entitled "Micro-Wire Electrode Buss" by Lebens et al, the disclosures of which are incorporated herein.

Reference is made to commonly-assigned U.S. patent application Ser. No. 13/571,704 filed Aug. 10, 2012, entitled "Micro-Wire Electrode Pattern" by Ronald S. Cok;

FIELD OF THE INVENTION

The present invention relates to micro-wire electrical conductors.

BACKGROUND OF THE INVENTION

Transparent conductors are widely used in the flat-panel display industry to form electrodes for electrically switching the light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Touch screens with transparent electrodes are widely used with electronic displays, especially for mobile electronic devices. Such devices typically include a touch screen mounted over an electronic display that displays interactive information. Touch screens mounted over a display device are largely transparent so a user can view displayed information through the touch-screen and readily locate a point on the touch-screen to touch and thereby indicate the information relevant to the touch. By physically touching, or nearly touching, the touch screen in a location associated with particular information, a user can indicate an interest, selection, or desired manipulation of the associated particular information. The touch screen detects the touch and then electronically interacts with a processor to indicate the touch and touch location. The processor can then associate the touch and touch location with displayed information to execute a programmed task associated with the information. For example, graphic elements in a computer-driven graphic user interface are selected or manipulated with a touch screen mounted on a display that displays the graphic user interface.

Referring to FIG. 10, a prior-art display and touch-screen system 100 includes a display 110 having a display area 111. A corresponding touch screen 120 is mounted with display 110 so that information displayed on display 110 in display area 111 can be viewed through touch screen 120. Graphic elements displayed on the display 110 in display area 111 are selected, indicated, or manipulated by touching a corresponding location on touch screen 120. Touch screen 120 includes a first transparent substrate 122 with first transparent electrodes 130 formed in the x dimension on first transparent substrate 122 and a second transparent substrate 126 with second transparent electrodes 132 formed in the y dimension facing the x-dimension first transparent electrodes 130 on second transparent substrate 126. A dielectric layer 124 is located between first and second transparent substrates 122, 126 and first and second transparent electrodes 130, 132. Referring also to the prior-art plan view of FIG. 11, in this example first pad areas 128 in first transparent electrodes 130 are located adjacent to second pad areas 129 in second transparent electrodes 132 in display area 111. (First and second pad areas 128, 129 are separated into different parallel planes by dielectric layer 124.) First and second transparent electrodes 130, 132 have a variable width and extend in orthogonal directions (for example as shown in U.S. Patent Application Publication Nos. 2011/0289771 and 2011/0099805). When a voltage is applied across first and second transparent electrodes 130, 132, electric fields are formed between first pad areas 128 of x-dimension first transparent electrodes 130 and second pad areas 129 of y-dimension second transparent electrodes 132.

A display controller 142 (FIG. 10) connected through electrical busses 136 controls display 110 in cooperation with a touch-screen controller 140. Touch-screen controller 140 is connected through electrical busses 136 and wires 134 outside display area 111 and controls touch screen 120. Touch-screen controller 140 detects touches on touch screen 120 by sequentially electrically energizing and testing x-dimension first and y-dimension second transparent electrodes 130, 132.

Referring to FIG. 12, in another prior-art embodiment, rectangular first and second transparent electrodes 130, 132 are arranged orthogonally in display area 111 projected from display 110 onto first and second transparent substrates 122, 126 with intervening transparent dielectric layer 124, forming touch screen 120 which, in combination with display 110 forms touch screen and display system 100. First and second pad areas 128, 129 are formed where first and second transparent electrodes 130, 132 overlap. Touch screen 120 and display 110 are controlled by touch screen and display controllers 140, 142, respectively, through electrical busses 136 and wires 134 outside display area 111.

The electrical busses 136 and wires 134 are electrically connected to first or second transparent electrodes 130, 132 but are located outside display area 111. However, at least a portion of electrical busses 136 or wires 134 are formed on touch screen 120 to provide the electrical connection to first or second transparent electrode 130, 132. It is desirable to increase the size of display area 111 with respect to the entire display 110 and touch screen 120. Thus, it can be helpful to reduce the size of wires 134 and busses 136 in touch screen 120 outside display area 111. At the same time, to provide excellent electrical performance, wires 134 and busses 136 need a low resistance. Furthermore, to reduce manufacturing costs, it is desirable to reduce the number of manufacturing steps and materials in touch screen 120.

Touch-screens including very fine patterns of conductive elements, such as metal wires or conductive traces, are known. For example, U.S. Patent Application Publication No. 2010/0026664 teaches a capacitive touch screen with a mesh electrode, as does U.S. Pat. No. 8,179,381. Referring to FIG. 13, a prior-art x- or y-dimension variable-width first or second transparent electrode 130, 132 includes a micro-pattern 156 of micro-wires 150 arranged in a rectangular grid. The micro-wires 150 are multiple very thin metal conductive traces or wires formed on the first and second transparent substrates 122, 126 (not shown in FIG. 13) to form the x- or y-dimension first or second transparent electrodes 130, 132. The micro-wires 150 are so narrow that they are not readily visible to a human observer, for example 1 to 10 microns wide. The micro-wires 150 are typically opaque and spaced apart, for example by 50 to 500 microns, so that the first or second transparent electrodes 130, 132 appear to be transparent and the micro-wires 150 are not distinguished by an observer.

U.S. Patent Application Publication No. 2011/0291966 discloses an array of diamond-shaped micro-wire structures. In this disclosure, a first electrode includes a plurality of first conductor lines inclined at a predetermined angle in clockwise and counterclockwise directions with respect to a first direction and provided at a predetermined interval to form a grid-shaped pattern. A second electrode includes a plurality of second conductor lines, inclined at the predetermined angle in clockwise and counterclockwise directions with respect to a second direction, the second direction perpendicular to the first direction and provided at the predetermined interval to form a grid-shaped pattern. This arrangement is used to inhibit Moiré patterns. The electrodes are used in a touch screen device. Referring to FIG. 14, this prior-art design includes micro-wires 150 arranged in a micro-pattern 156 with the micro-wires 150 oriented at an angle to the direction of horizontal first transparent electrodes 130 in a first layer (e.g. first transparent substrate 122 in FIG. 12) and vertical second transparent electrodes 132 in a second layer (e.g. second transparent substrate 126 in FIG. 12).

A variety of layout patterns are known for micro-wires used in transparent electrodes. U.S. Patent Application Publication No. 2012/0031746 discloses a number of micro-wire electrode patterns, including regular and irregular arrangements. The conductive pattern of micro-wires in a touch screen can be formed by closed figures distributed continuously in an area of 30% or more, preferably 70% or more, and more preferably 90% or more of an overall area of the substrate and can have a shape where a ratio of standard deviation for an average value of areas of the closed figures (a ratio of area distribution) can be 2% or more. As a result, a Moiré phenomenon can be prevented and excellent electric conductivity and optical properties can be satisfied. U.S. Patent Application Publication No. 2012/0162116 discloses a variety of micro-wire patterns configured to reduce or limit interference patterns. As illustrated in prior-art FIG. 15, U.S. Patent Application Publication No. 2011/0007011 teaches a first or second transparent micro-wire electrode 130, 132 having micro-wires 150 arranged in a micro-wire pattern 156.

However, as noted above, it is useful to form electrical busses 136 and wires 134 with a reduced size compared to transparent micro-wire electrodes outside display area 111 in touch screen 120. To provide excellent electrical performance, wires 134 and electrical busses 136 need a low resistance. It is also desirable to reduce the number of manufacturing steps and materials in touch screen 120. There is a need, therefore, for an improved electrically conductive structure that is compatible with transparent electrodes, provides improved conductivity, and is robust in the presence of faults.

SUMMARY OF THE INVENTION

In accordance with the present invention, a conductive micro-wire structure comprises:
a substrate;
a plurality of spaced-apart electrically connected micro-wires formed on or in the substrate forming the conductive micro-wire structure; and
wherein the conductive micro-wire structure has a transparency of less than 75% and greater than 0%.

The present invention provides a conductive micro-wire structure capable of conducting relatively large electrical currents in a relatively small area compared to transparent micro-wire electrodes and is robust in the presence of faults in the micro-wires. The conductive micro-wire structure can be constructed in a common manufacturing step and in or on a common substrate with transparent micro-wire electrodes providing a simplified micro-wire structure and electrical circuit for devices controlling transparent micro-wire electrodes.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIG. 8 is a plan view of a conductive micro-wire structure pattern electrically connected to a transparent micro-wire electrode illustrating an embodiment of the present invention;

FIG. 18 is a cross section illustrating a trapezoidal micro-channel useful in the present invention;

FIG. 19 is a cross section illustrating a micro-wire located in the micro-channel of FIG. 18 useful in the present invention;

Figure 1:
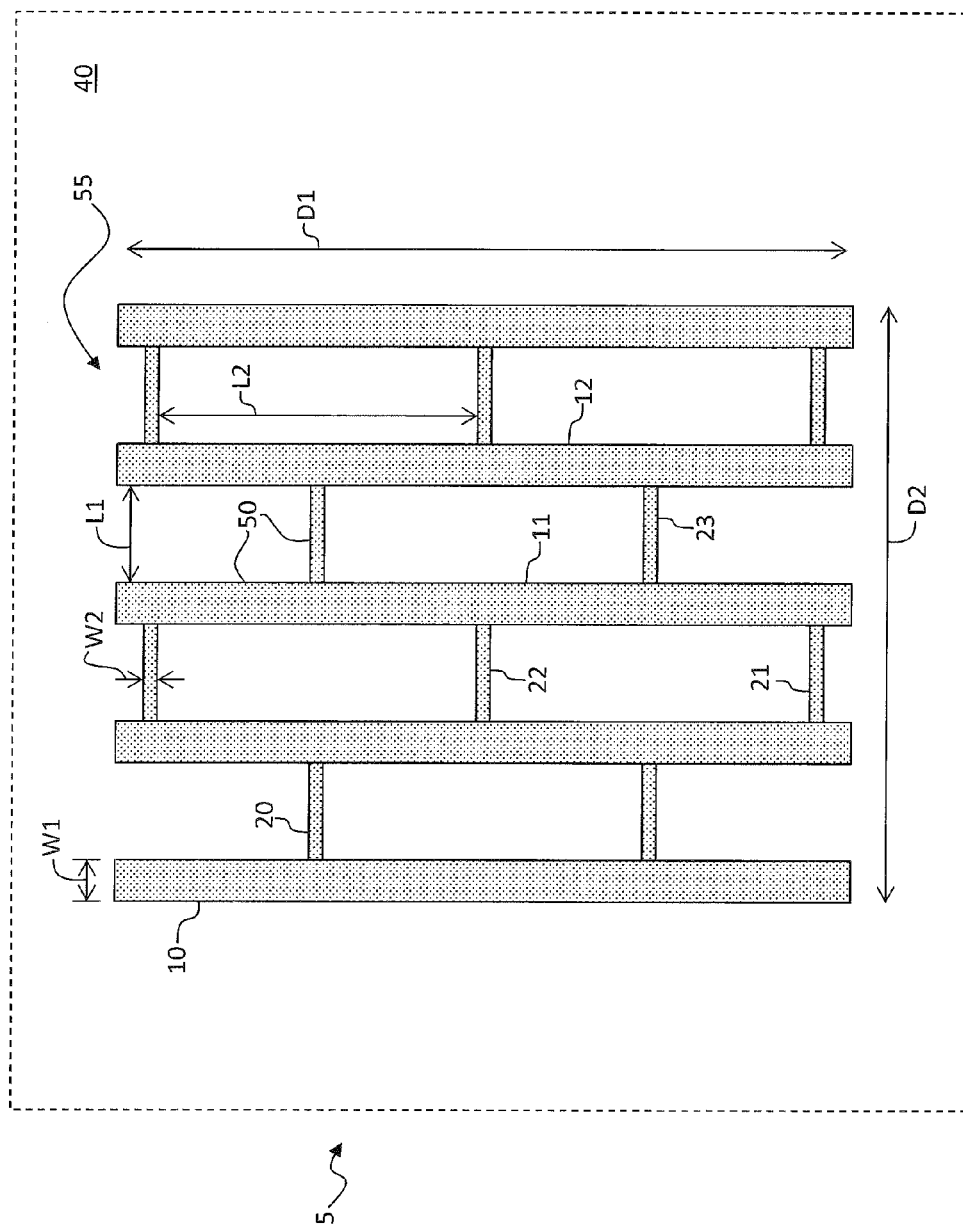
FIGS. 1-7 are plan views of various conductive micro-wire structure patterns illustrating corresponding embodiments of the present invention.

The Figures are not necessarily to scale, since the range of dimensions in the drawings is too great to permit depiction to scale.

DETAILED DESCRIPTION OF THE INVENTION

The present invention is directed toward electrically conductive micro-wire structures formed on or in a substrate that are capable of conducting relatively large electrical currents in relatively small areas with reduced electrical resistance compared to transparent micro-wire electrodes. The electrically conductive micro-wire structures are robust in the presence of faults in the micro-wires and can be constructed in a common manufacturing step in or on a common substrate with transparent micro-wire electrodes. As used herein, the substrates are not integrated circuit substrates and are of a size with which a human user can directly interact. Such micro-wire structures can provide simplified electrically conductive elements and electrical circuits for controlling or interconnecting with transparent micro-wire electrodes. The electrically conductive micro-wire structures of the present invention can also be useful in other applications and are not limited to applications having transparent micro-wire electrodes.

In particular, transparent micro-wire electrodes known in the prior art including spaced-apart micro-wires located on either side of a dielectric layer are known for making capacitive touch screens (e.g. as illustrated in FIGS. 10-15 and discussed above). Such transparent micro-wire electrodes typically have a transparency of 85%, or more preferably greater than 90%. An objective of such prior-art transparent micro-wire electrodes is to provide both transparency and conductivity over the extent of a substrate, for example over the display area of a capacitive touch screen (e.g. display area 111 and touch screen 120 of FIG. 12).

In operation, such prior-art transparent micro-wire electrodes are electrically connected to a controller. The electrical connections are typically made using solid-wire electrical conductors (often called traces) formed on the same substrate as the transparent micro-wire electrodes. Such solid-wire electrical conductors are commonly found in printed circuit boards or on flexible substrates in electronic devices. Solid-wire electrical conductors are typically greater than 100 microns wide, are often greater than one mm wide, and can be made by pattern-wise etching a layer of conductive material formed on the substrate.

Separate solid-wire electrical conductors can be used in multi-wire busses or as single wires that electrically connect to a controller such as an integrated circuit processor that operates the transparent micro-wire electrodes. In some prior-art devices, the integrated circuit processor is adhered to the same substrate; in others a connector from the substrate to the integrated circuit processor is needed.

In any case, the prior-art solid-wire conductors are made using conventional processes such as those used in printed circuit boards or flat-panel display substrates that can be different from the processes used to make transparent micro-wire electrodes. Thus, additional processing steps and processing conditions are useful to electrically connect prior-art transparent micro-wire electrodes on a substrate to a connector or controller. Such additional processing steps and conditions increase costs and reduce the range of usable materials.

According to embodiments of the present invention, electrically conductive micro-wire structures provide greater conductivity in smaller areas than are achieved with conventional transparent micro-wire electrodes. Such electrically conductive micro-wire structures have a transparency that is less than the transparency of transparent micro-wire electrodes. In contrast to disclosures of the prior art, the conductive micro-wire structures of the present invention are not necessarily visually transparent. Thus, the prior art, by emphasizing the transparency of micro-wire electrodes, teaches away from the present invention. For example, U.S. Pat. No. 8,179,381 discloses a transparent micro-wire electrode with micro-wires between $0.5\mu$ and $4\mu$ wide and a transparency of between approximately 86% and 96%.

The electrically conductive micro-wire structures of the present invention can be made using the same processes and in the same steps as are used to construct conventional transparent micro-wire electrodes. The present invention, therefore, reduces manufacturing costs and does not further reduce the range of materials that can be used in a substrate having micro-wire electrical conductors formed thereon.

It has been discovered through experimentation, that useful methods of making micro-wires in a substrate can be limited in the number, size, and spacing of the micro-wires made. Thus, there is a limit to the amount of material, for example metal, that forms micro-wires in a given area on a substrate. This, in turn, limits the number, size, and spacing of micro-wires in or on the substrate. For example, it has been demonstrated that micro-wires can be made in a substrate surface embossed with micro-channels by coating the substrate with a conductive ink or immersing the substrate in a bath of conductive ink and then removing excess material not in the micro-channels. However, it has also been demonstrated that if the micro-channels are too large, are too close together, or are too interconnected, any resulting micro-wires are not clearly defined and their shape is not controlled well. Similarly, in another example, a print master (for example a flexographic printing plate) having a relief pattern is coated with a conductive ink and the pattern transferred to a substrate. If the pattern includes relatively large areas, areas that are too close together, or areas that are too interconnected, the resulting pattern is not clearly defined and the shape of any printed micro-wires is not controlled well.

Poorly defined electrically conductive patterns on a substrate can lead to unwanted electrical conduction, such as electrical shorts. Thus, there can be a limit, not recognized in the prior art, to the density and size with which micro-wires can be formed in a substrate using some useful methods for making micro-wires in a substrate. Such useful methods can have reduced costs or improved manufacturing efficiencies or performance, and there is therefore a need for electrically conductive micro-wire structures and patterns that avoid such manufacturing constraints. Not only are the size and density limits for micro-wires, made according to some manufacturing methods, not recognized in the prior art, the desirability of forming such highly conductive, less transparent electrically conductive micro-wire structures is not recognized or is not appreciated.

In various embodiments, the electrically conductive micro-wire structures of the present invention are used to make electrical conductors and busses for electrically connecting transparent micro-wire electrodes to electrical connectors or controllers such as integrated circuit controllers. One or more electrically conductive micro-wire structures are used in a single substrate and are used, for example in touch screens that use transparent micro-wire electrodes. The electrically conductive micro-wire structures are located in areas other than display areas, for example in the perimeter of the display area of a touch screen, where the display area is the area through which a user views a display.

Referring to FIG. 1 in an embodiment of the present invention, a conductive micro-wire structure 5 includes a substrate 40. A plurality of micro-wires 50 forming an electrical conductor is formed in or on substrate 40. A micro-wire pattern 55 of micro-wires 50 includes spaced-apart first micro-wires 10 formed on or in substrate 40 that extend across substrate 40 in a first direction D1. A plurality of spaced-apart second micro-wires 20 are formed on or in substrate 40 and extend across substrate 40 in a second direction D2 different from first direction D1. Each second micro-wire 20 is electrically connected to at least two first micro-wires 10 and at least one of second micro-wires 20 has a width W2 less than a width W1 of at least one of the first micro-wires 10. As shown in the embodiment of FIG. 1, second micro-wires 20 are spaced apart by a distance L2 that is greater than a distance L1 separating first micro-wires 10.

Substrate 40 can be a rigid or a flexible substrate made of, for example, a glass or polymer material, can be transparent, and can have opposing substantially parallel and extensive surfaces. Substrates 40 can include a dielectric material useful for capacitive touch screens and can have a wide variety of thicknesses, for example 10 microns, 50 microns, 100 microns, 1 mm, or more. In various embodiments of the present invention, substrates 40 are provided as a separate structure or are coated on another underlying substrate, for example by coating a polymer substrate layer on an underlying glass substrate. Such substrates 40 and their methods of construction are known in the prior art. Substrate 40 can be an element of other devices, for example the cover or substrate of a display or a substrate or dielectric layer of a touch screen.

Figure 17:
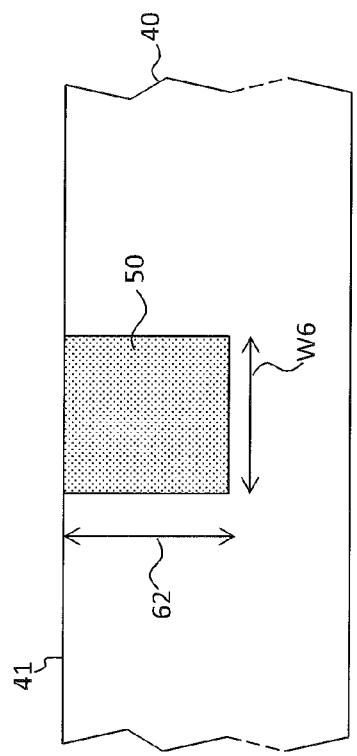
FIG. 17 is a cross section illustrating a micro-wire located in the micro-channel of FIG. 16 useful in the present invention.

Referring briefly to FIG. 17 (discussed further below), a width W6 of a micro-wire 50 is the linear extent of a cross section of micro-wire 50 in a direction parallel to the extensive surface 41 of substrate 40 on or in which micro-wire 50 is located. A thickness 62 of a micro-wire 50 is the linear extent of a cross section of the micro-wire 50 in a direction perpendicular to surface 41 of substrate 40 on or in which micro-wire 50 is located. Thickness 62 is also the depth micro-wire 50 extends from surface 41 of substrate 40. The length of micro-wire 50 is the linear extent of micro-wire 50 over or in and parallel to surface 41 of substrate 40 on or in which micro-wire 50 is located. The length of micro-wire 50 is greater than the width or thickness of micro-wire 50. The length, width, and thickness (depth) of micro-wire 50 are typically substantially orthogonal dimensions. For example, referring back to the example of FIG. 1, the length of micro-wires 50 extends in either first or second direction D1 or D2. Distance L1 is the length of second micro-wires 20.

According to embodiments of the present invention, micro-wires 50 (e.g. first and second micro-wires 10, 20) extend across substrate 40. By "extend across" is meant that micro-wires 50 are longer than they are wide and the length of micro-wires 50 is in a direction parallel to a surface of substrate 40. The length of first or second micro-wires 10, 20 is typically less than the size of a surface of substrate 40 in any planar dimension. In particular, "extend across" does not mean that any micro-wire 50 has a length equal to the size of any planar surface dimension of substrate 40 or extends across substrate 40 from one edge of substrate 40 to another.

Referring to FIG. 8, in an alternative embodiment of the present invention, micro-wires 50 are arranged in a micro-wire pattern 55 to form an electrical conductor connected to an electrode structure. The electrical conductor includes a plurality of spaced-apart first micro-wires 10 extending in a first direction D1. One of first micro-wires 10 is a connection micro-wire 14. A plurality of spaced-apart second micro-wires 20 extends in a second direction D2 different from first direction D1. At least two adjacent second micro-wires (21, 22) are spaced apart by a distance L2 greater than distance L1 spacing apart at least two adjacent first micro-wires 11, 12 and each second micro-wire 20 is electrically connected to at least two first micro-wires 10. The electrode structure includes a plurality of electrically connected third micro-wires 30 electrically connected to connection micro-wire 14 at spaced-apart connection locations 34. At least some of the adjacent connection locations 34 are separated by a distance L3 greater than any of distances L2 separating second micro-wires 20. Third micro-wires 30 can form a transparent micro-wire structure, for example an apparently transparent electrode.

First, second, and third micro-wires 10, 20, and 30, can be formed in a common process step and with common materials. Alternatively, different process steps and different materials can be used.

First, second, and third micro-wires 10, 20, and 30 can be identical. Third micro-wires 30 can form a transparent electrode and first and second micro-wires 10, 20 can form electrically conductive micro-wire structure 5 with a higher electrical conductivity, since first and second micro-wires 10, 20 are located more densely over substrate 40. In an embodiment, because the pattern of micro-wires 50 formed by the plurality of first and second micro-wires 10, 20 has a transparency that is typically less than the transparency of the pattern of micro-wires 50 formed by the plurality of third micro-wires 30, the pattern of micro-wires 50 formed by the plurality of first and second micro-wires 10, 20 has an electrical resistance that is less than the micro-wire pattern 55 of micro-wires 50 formed by the plurality of third micro-wires 30.

Referring again to FIG. 1, in yet another embodiment of the present invention, an electrically conductive micro-wire structure 5 includes a substrate 40 and a plurality of spaced-apart electrically connected micro-wires 50 formed on or in substrate 40. Electrically conductive micro-wire structure 5 has a transparency of less than 75% and greater than 0%. The transparency of electrically conductive micro-wire structure 5 is the percent of the substrate area over which micro-wires 50 extend that is not covered by micro-wires 50. As illustrated in FIG. 1, the total area over which micro-wires 50 extend is the product of the lengths of directional arrows D1 and D2. In this example, the percent of the total area covered by the micro-wires 50 is about 38%. Thus, the transparency of conductive micro-wire structure 5 of FIG. 1 is about 62%. The transparency of the conductive micro-wire structure 5 can be controlled by changing distance L1 between first micro-wires 10, width W1 of first micro-wires 10, distance L2 between second micro-wires 20, and width W2 of second micro-wires 20 relative to each other.

Electrically conductive micro-wire structure 5 of the present invention can have a direction of greater or preferred conductance. For example, as shown in FIG. 1, because first micro-wires 10 are wider and more closely spaced apart than second micro-wires 20, the conductance per unit length of electrically conductive micro-wire structure 5 will be greater in first direction D1 than in second direction D2.

The present invention includes a wide variety of micro-wire pattern variations. These variations can apply to both of the micro-wire patterns 55 illustrated in FIGS. 1 and 8. For example, in embodiments illustrated in FIGS. 1 and 8, electrically conductive micro-wire structure 5 includes at least one second micro-wire 20 with a width W2 less than any of widths W1 of first micro-wires 10. Alternatively, each second micro-wire 20 has a width W2 less than any of widths W1 of first micro-wires 10. First micro-wires 10 can have a common first width W1. Alternatively, or in addition, second micro-wires 20 can have a common second width W2.

Similarly, in the embodiments of FIGS. 1 and 8, electrically conductive micro-wire structure 5 includes at least two adjacent second micro-wires 21, 22 that are spaced apart by a distance L2 greater than distance L1 between any two adjacent first micro-wires 11, 12. Alternatively, micro-wire pattern 55 can include adjacent first micro-wires 11, 12 that are substantially equally spaced apart or adjacent second micro-wires 21, 22, 23 that are substantially equally spaced apart.

Figure 2:
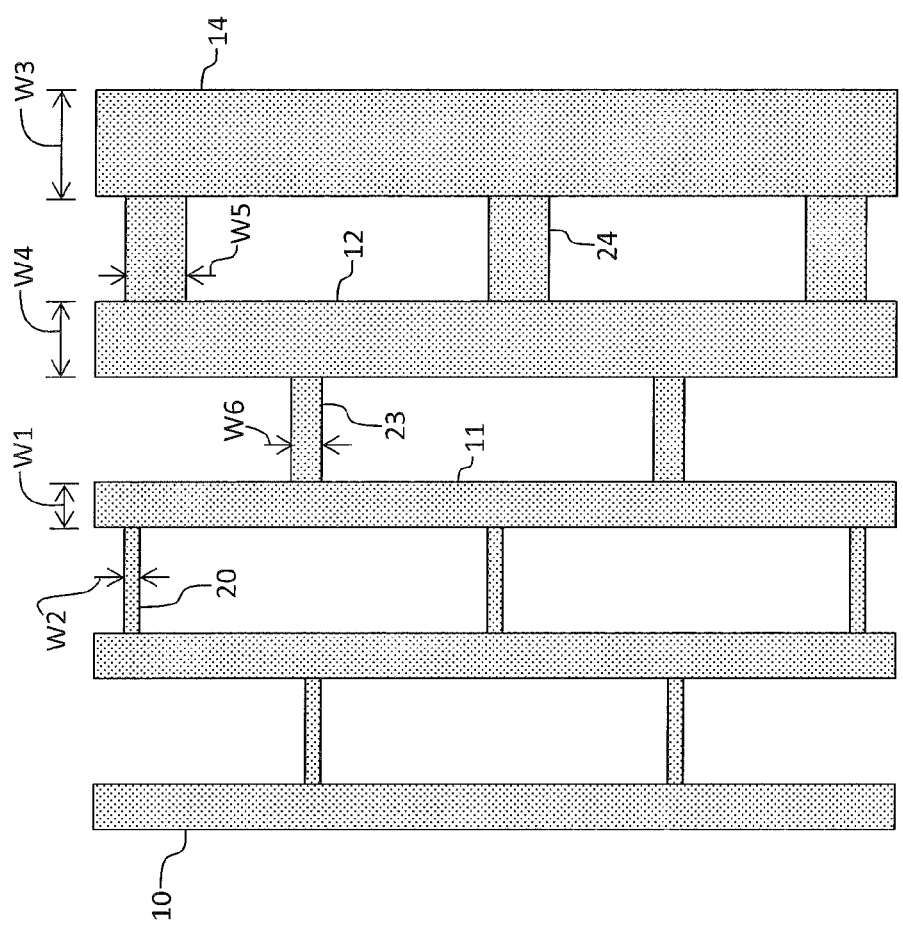

Referring to FIG. 2, in other embodiments of the present invention, connection micro-wire 14 has a width W3 that is wider than width W1 of at least one other first micro-wire 10, 11, 12. Alternatively, at least one of first micro-wires 12 that is closer to connection micro-wire 14 has a width W4 that is wider than width W1 of at least one other first micro-wire 11 that is farther from connection micro-wire 14 than first micro-wire 12. Furthermore, in another embodiment illustrated in FIG. 2, at least one of second micro-wires 24 closer to connection micro-wire 14 has a width W5 that is wider than a width W6 of another second micro-wire 23 that is farther from connection micro-wire 14 than second micro-wire 24. Furthermore, since second micro-wire 20 is farther from connection micro-wire 14 than second micro-wire 23, second micro-wire 23 has a width W6 that is wider than width W2 of second micro-wire 20.

Figure 3:
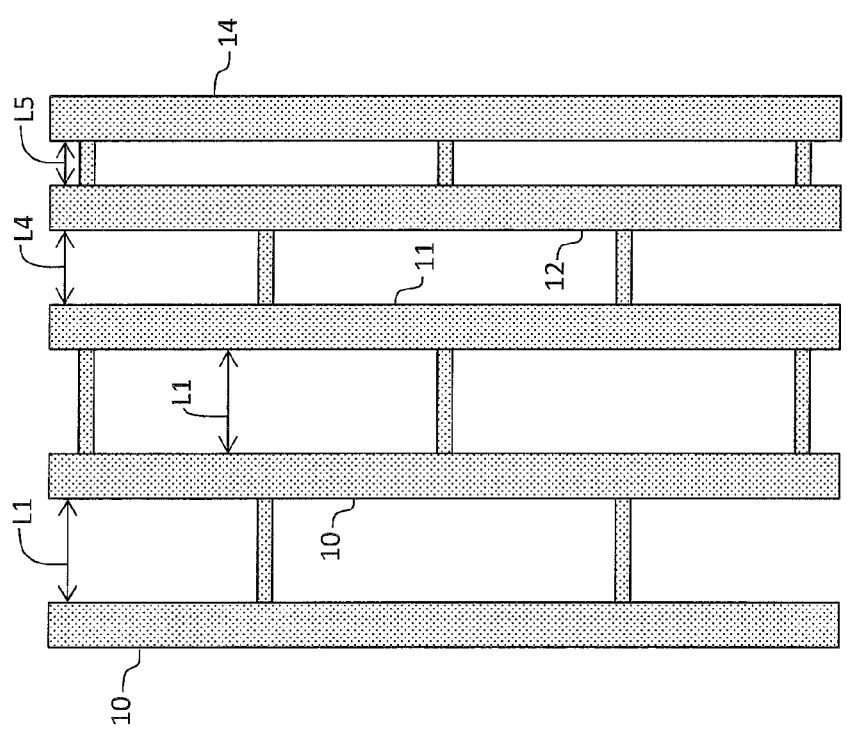

Referring to FIG. 3, in another embodiment of the present invention, at least two adjacent first micro-wires 11, 12 closer to connection micro-wire 14 are more closely spaced apart than at least two adjacent first micro-wires 10 that are farther from connection micro-wire 14. As shown in FIG. 3, connection micro-wire 14 is spaced apart from first micro-wire 12 by a distance L5 that is smaller than a distance L4 separating first micro-wire 11 from first micro-wire 12. Furthermore, distance L4 separating first micro-wire 11 from first micro-wire 12 is smaller than distance L1 separating first micro-wires 10 or first micro-wire 10 and first micro-wire 11. First micro-wires 10 are farthest from connection micro-wire 14, followed by first micro-wire 11 and then first micro-wire 12.

Figure 4:
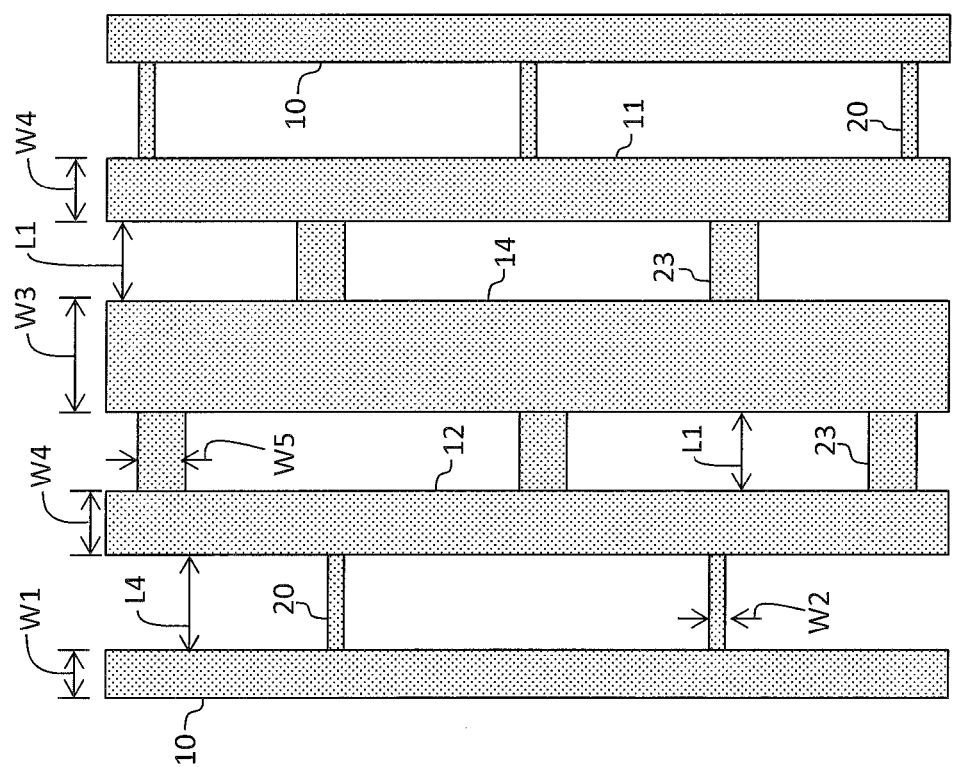

Referring to the embodiment illustrated in FIG. 4, connection micro-wire 14 has first microwires 11, 12 on either side, rather than on only one side, as in FIG. 3. In this embodiment, connection micro-wire 14 has a width W3. First micro-wires 11, 12 closest to connection micro-wire 14 have a width W4 that is less than width W3 but is greater than width W1 of first micro-wires 10 that are farther from connection micro-wire 14 than are first micro-wires 11 and 12. Similarly, second micro-wires 23 closer to connection micro-wire 14 have a width W5 that is greater than width W2 of second micro-wires 20 that are farther from connection micro-wire 14 than are second micro-wires 23. First micro-wire 10 having width W1 is spaced apart from first micro-wire 10 having width W4 by a distance L4 that is greater than a distance L1 that spaces apart first micro-wire 10 having width W3 from first micro-wire 10 having width W4.

Figure 9A:
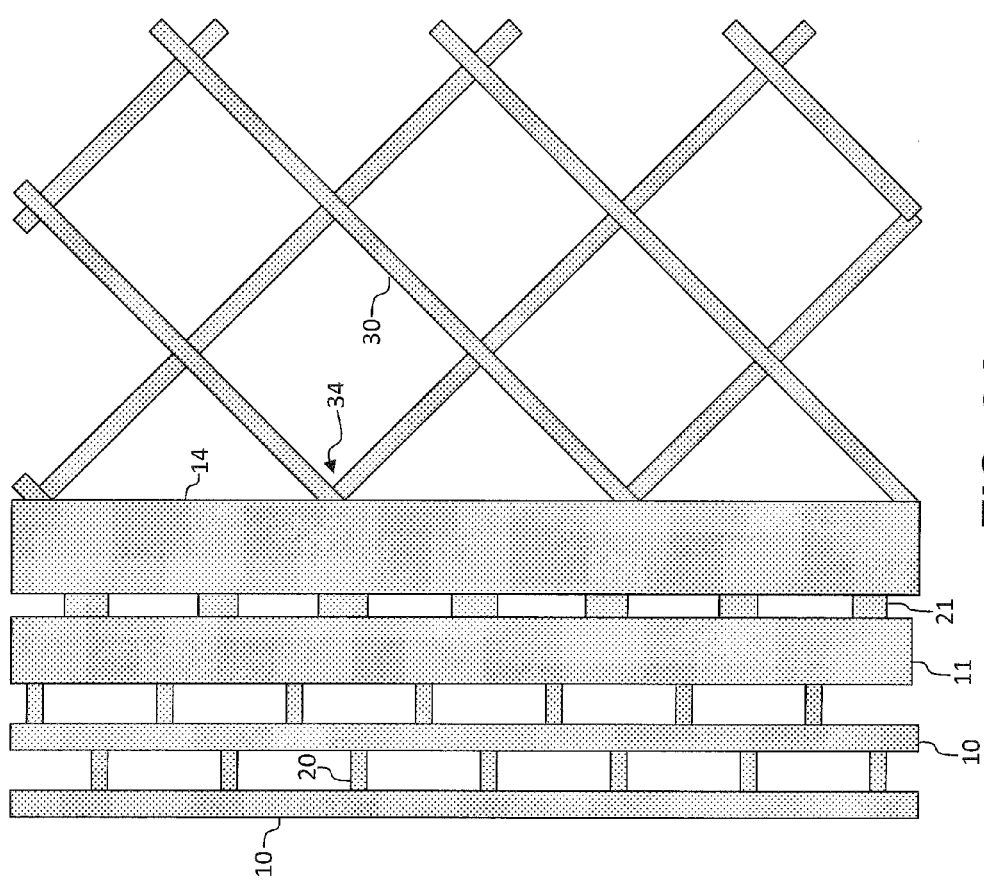
FIGS. 9A-9B are plan views of conductive micro-wire structure patterns electrically connected to a transparent micro-wire electrode illustrating other embodiments of the present invention.
Figure 9B:
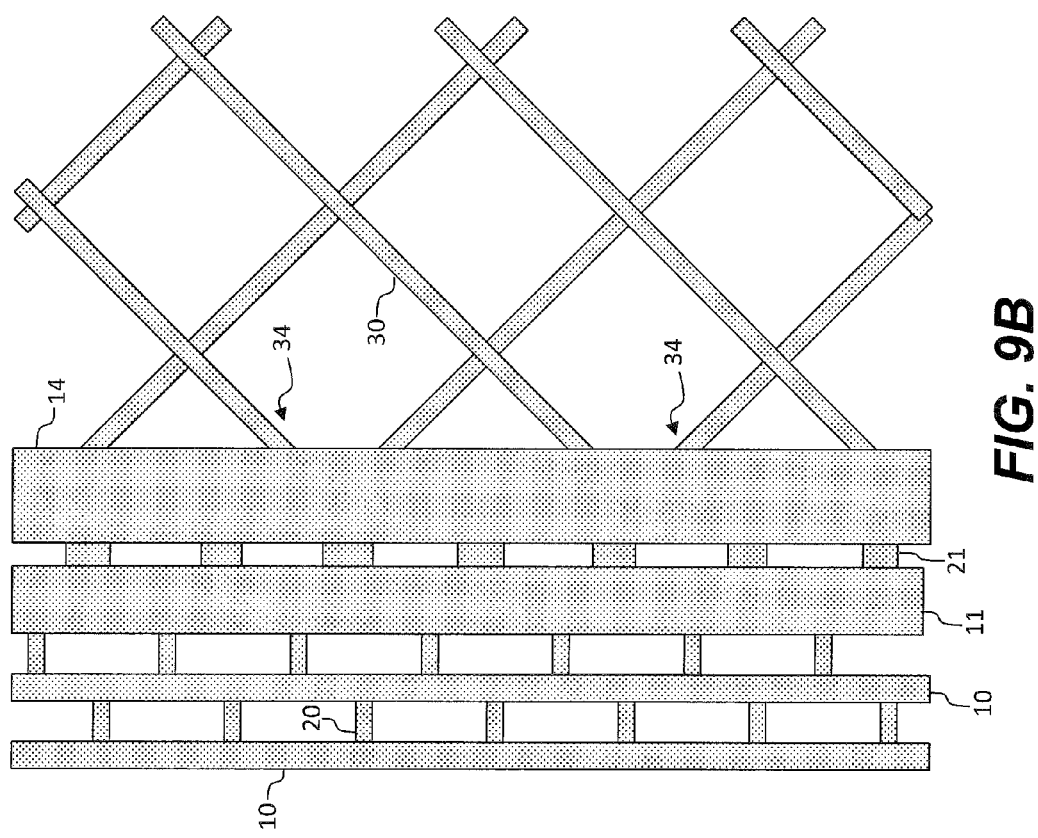
Figure 10:
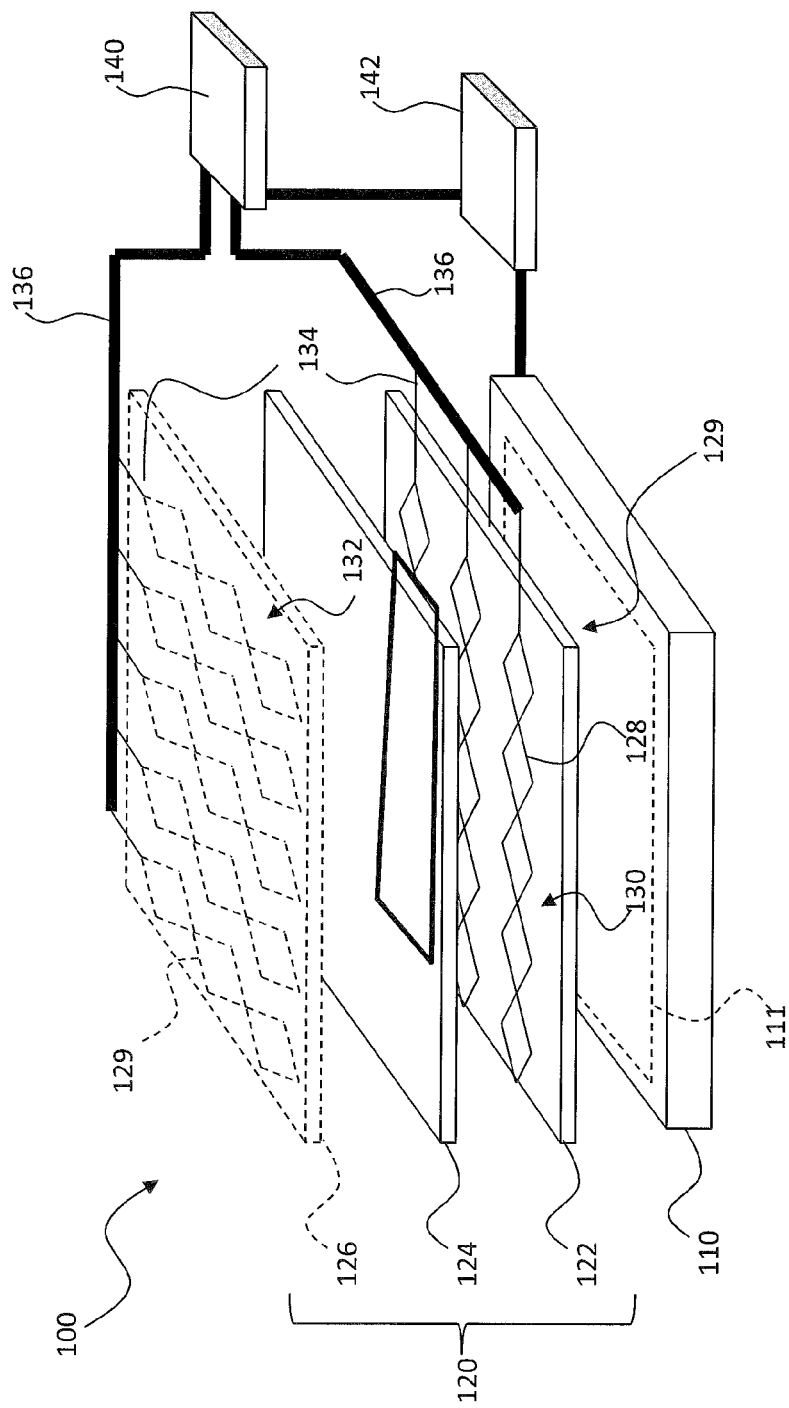
FIG. 10 is an exploded perspective illustrating a prior-art mutual capacitive touch screen having adjacent pad areas in conjunction with a display and controllers.
Figure 11:
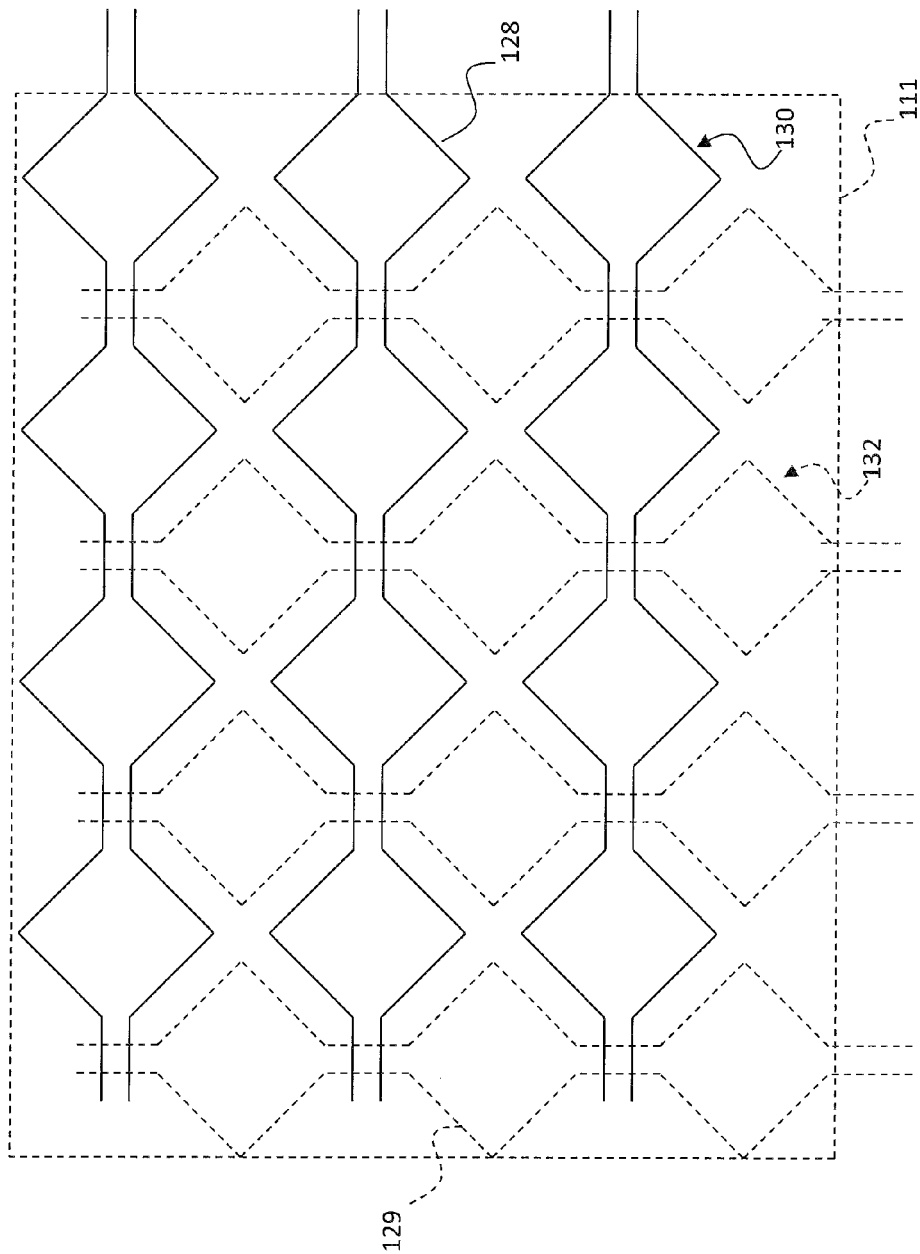
FIG. 11 is a schematic illustrating prior-art pad areas in a capacitive touch screen.
Figure 12:
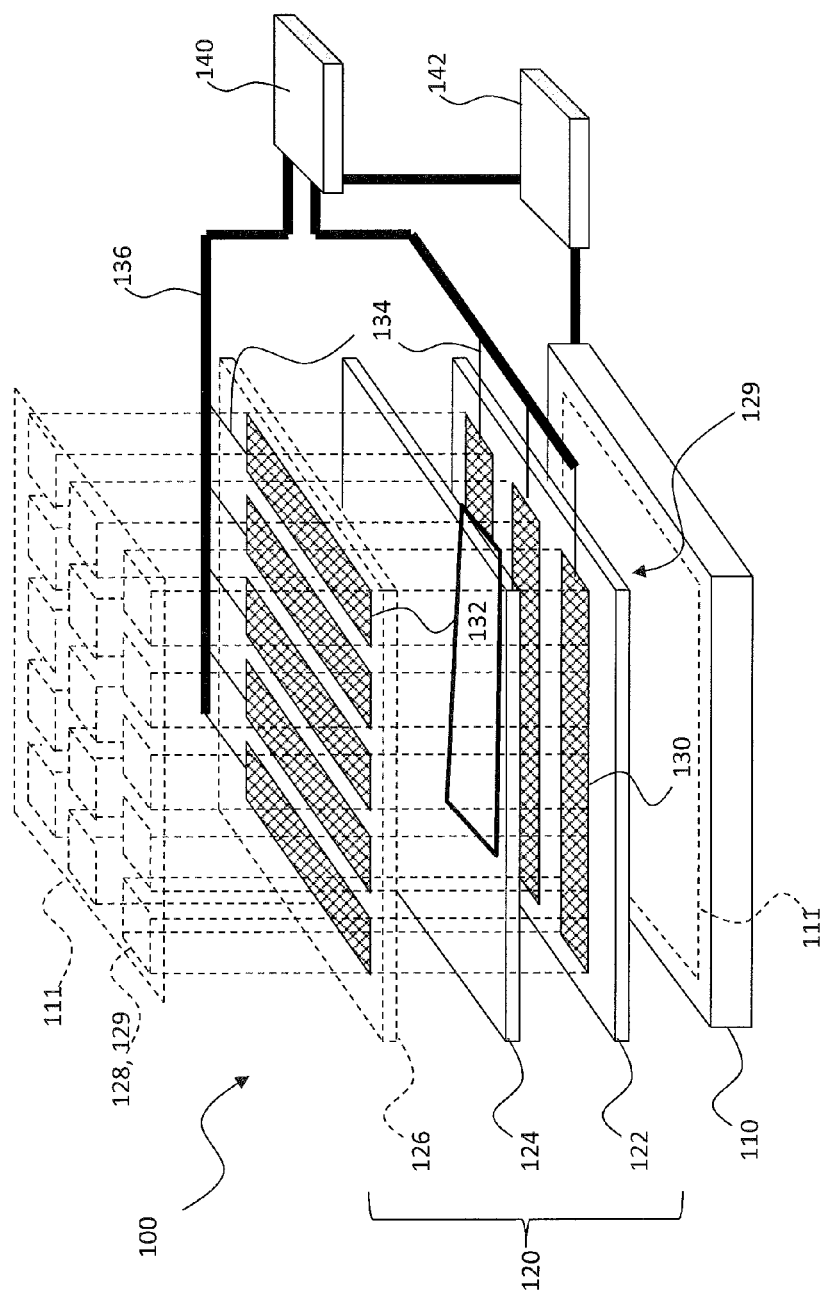
FIG. 12 is an exploded perspective illustrating a prior-art mutual capacitive touch screen having overlapping pad areas in conjunction with a display and controllers.
Figure 13:
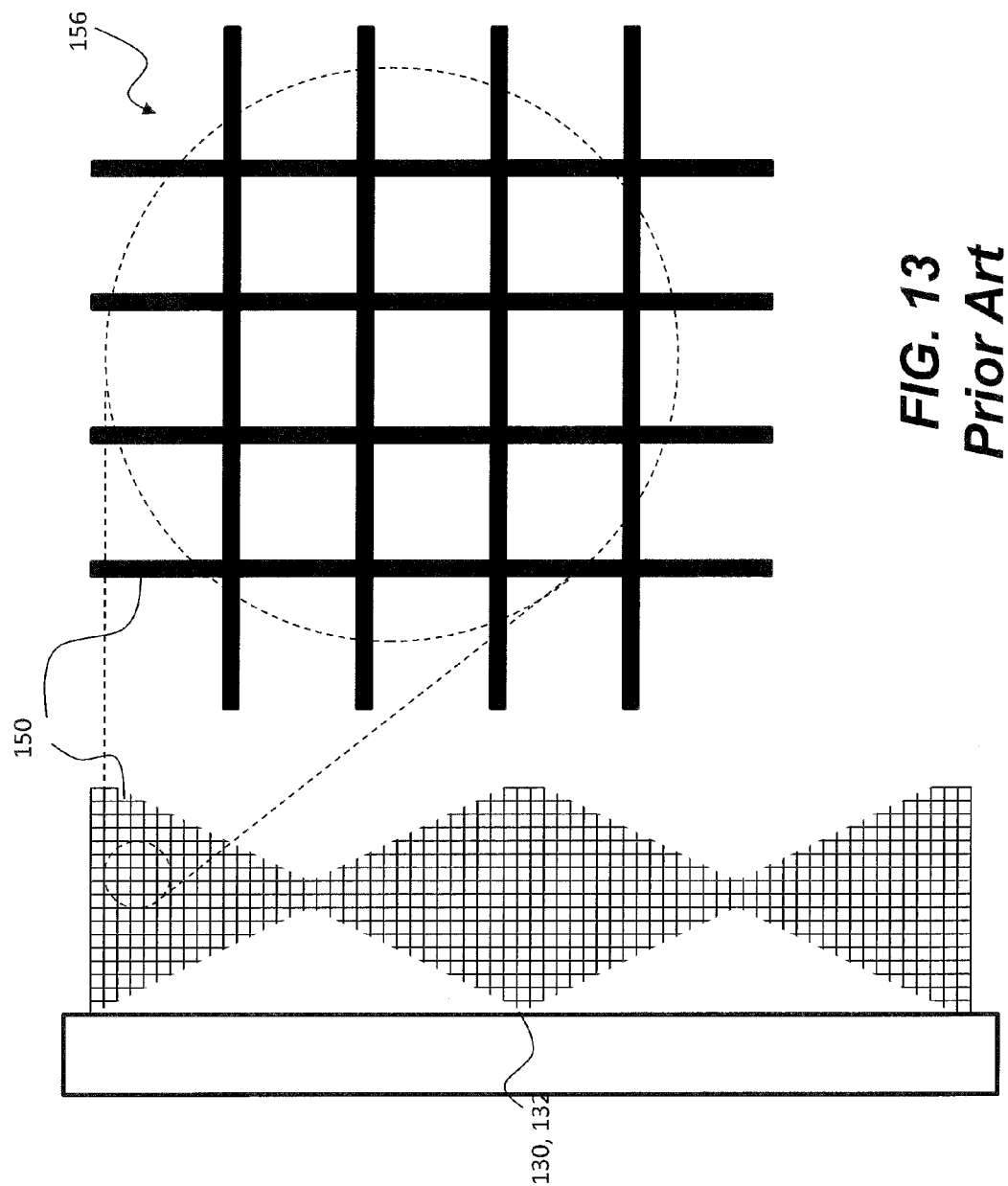
FIG. 13 is a schematic illustrating prior-art micro-wires in an apparently transparent electrode.
Figure 14:
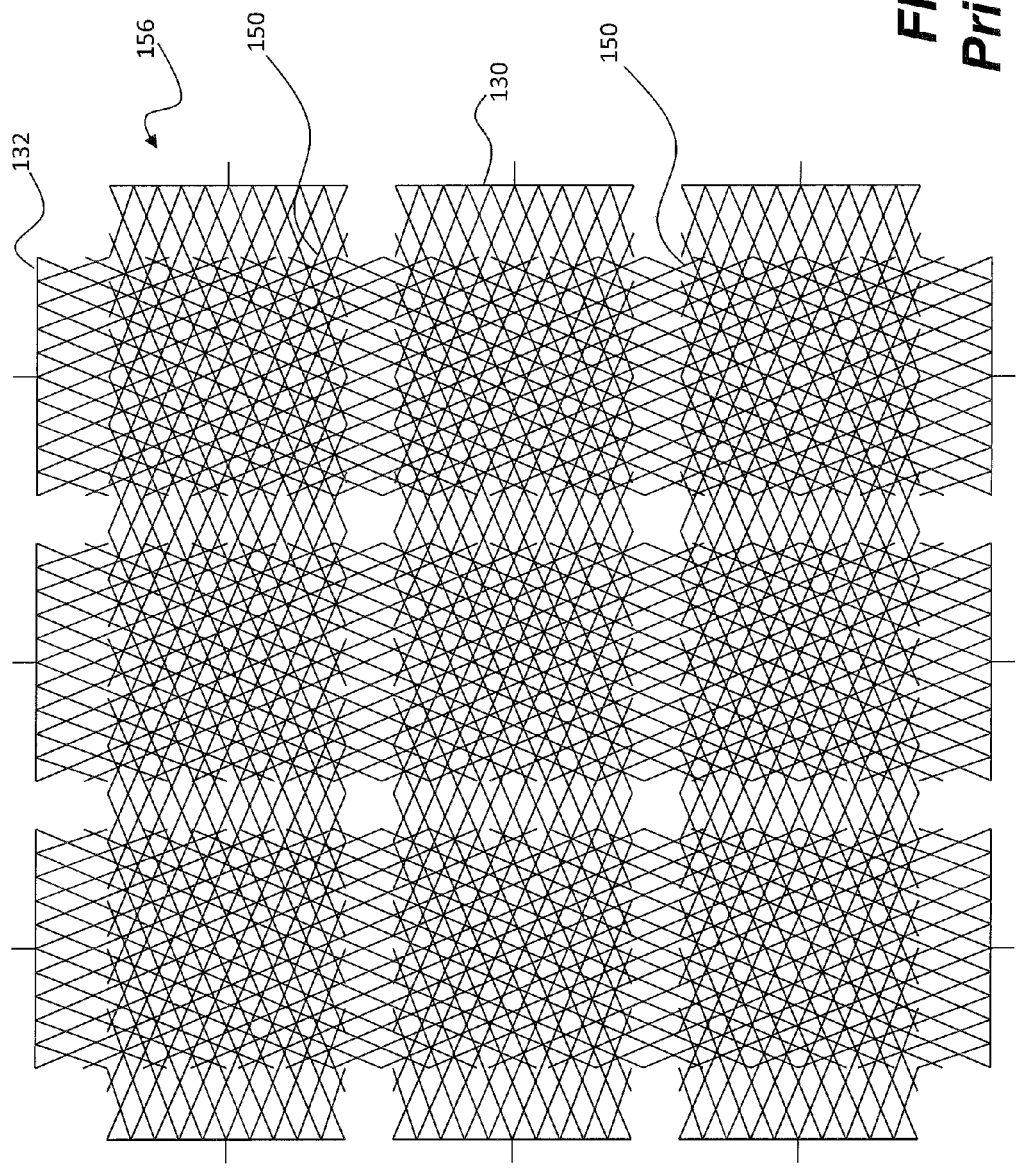
FIG. 14 is a schematic illustrating prior-art transparent micro-wire electrodes arranged in two arrays of orthogonal transparent electrodes.
Figure 15:
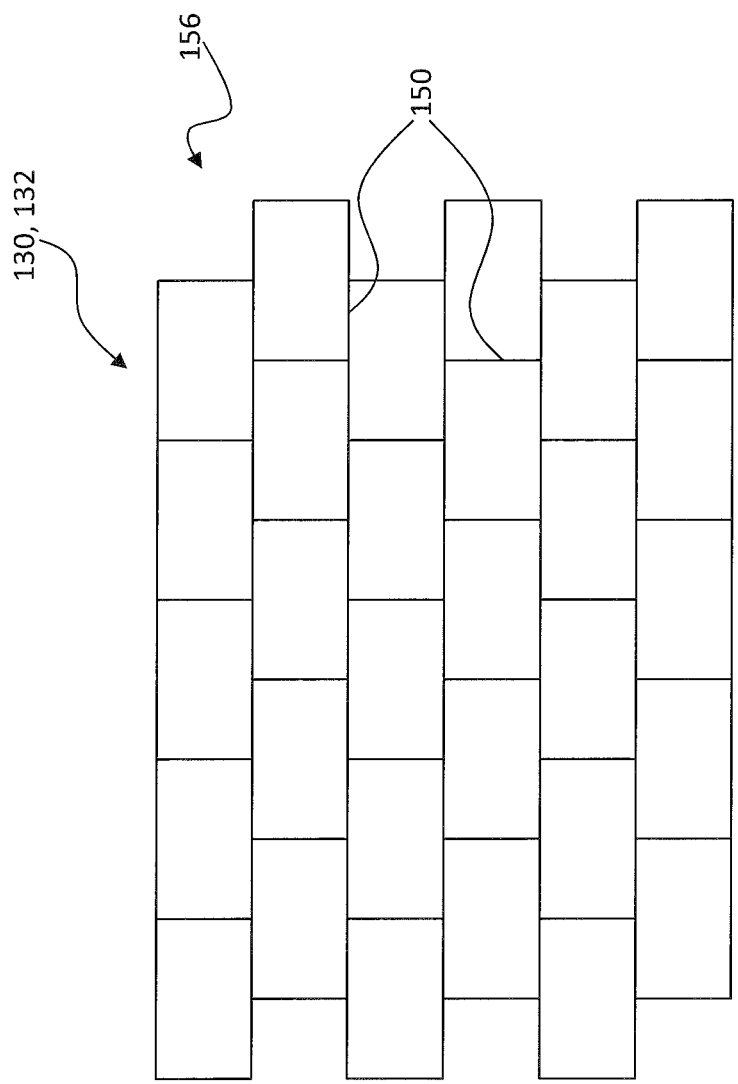
FIG. 15 is a schematic illustrating a prior-art transparent micro-wire electrode.

In another embodiment, FIGS. 9A and 9B illustrate connection micro-wire 14 wider than third micro-wires 30 or first micro-wire 11. First micro-wire 11, closer to connection micro-wire 14 than first micro-wire 10, is wider than first micro-wire 10. Likewise, second micro-wire 21, closer to connection micro-wire 14 than second micro-wire 20, is wider than second micro-wire 20. Furthermore, first micro-wire 11, closer to connection micro-wire 14 than first micro-wire 10, is more closely spaced apart from connection micro-wire 14 than first micro-wire 10 is spaced apart from first micro-wire 11. As shown in FIG. 9A, connection locations 34 are formed at the intersection of two micro-wires 30 and connection micro-wire 14. In this embodiment, the adjacent connection locations 34 are separated by a distance greater than the distance separating vertically adjacent second micro-wires 20. As shown in FIG. 9B, connection locations 34 are formed where single micro-wires 30 intersect with connection micro-wire 14. In this embodiment, alternating pairs of adjacent connection locations 34 are separated by a distance greater than the distance separating vertically adjacent second micro-wires 20.

Variably spaced first micro-wires 10 or first or second micro-wires 10, 20 having different widths improve the conductance of electrically conductive micro-wire structure 5 in the direction of preferred conductance when the number, size, or pattern of first or second micro-wires 10, 20 is constrained in a given substrate area. Improved electrical conduction is also provided by providing the wider first or second micro-wires 10, 20 or reduced first micro-wire 10 spacing closer to connection micro-wire 14 connected along its length to third micro-wires 30 along the direction of preferred conductance. Mathematical models demonstrate that electrical conductance is improved in the direction of preferred conduction, depending on the relative widths and spacing of first and second micro-wires 10, 20, for example by 4, 6, or 8 percent.

Figure 6:
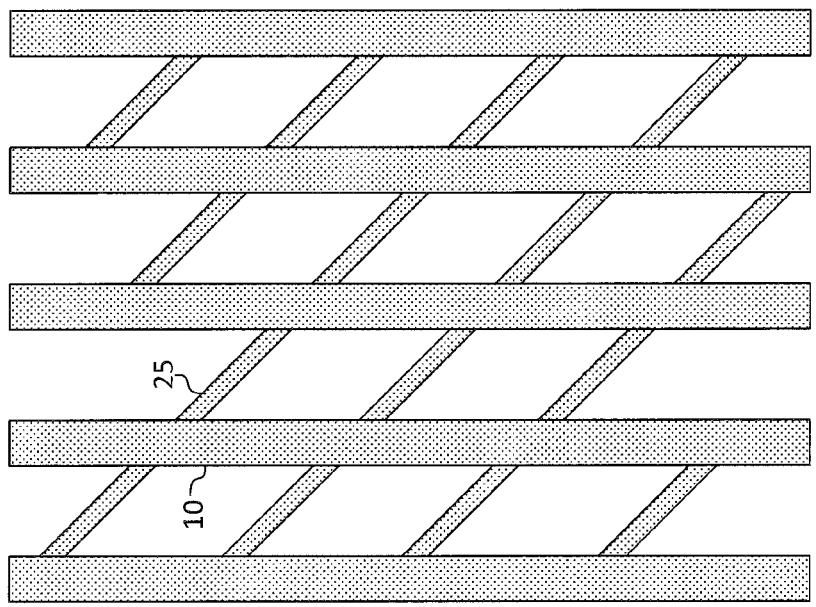
Figure 5:
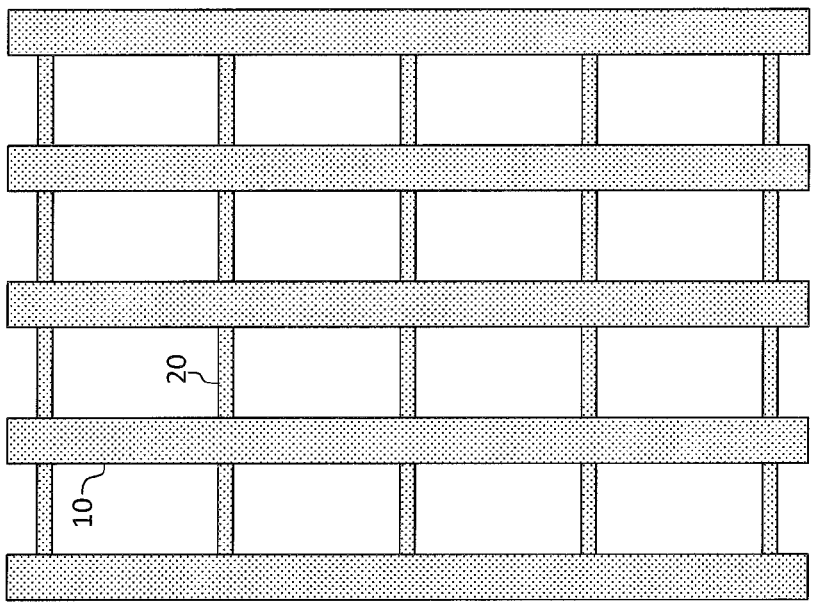

In one embodiment of the present invention, one or more of second micro-wires 20 is electrically connected to only two adjacent first micro-wires 10, intersecting first micro-wires 10 at substantially 90 degrees, as illustrated in FIGS. 1-4. Referring to FIG. 5, in another embodiment, second micro-wires 20 are electrically connected to multiple first micro-wires 10. In this case, first and second micro-wires 10, 20 form a rectangular grid for which second micro-wires 20 intersect first micro-wires at substantially 90-degree angles. Alternatively, as shown in FIG. 6, angled second micro-wires 25 intersect first micro-wires 10 at angles other than 90 degrees. Commonly assigned U.S. patent application Ser. No. 13/571,704 hereby incorporated by reference in its entirety, discloses a variety of micro-wire patterns 55 including angled, straight, intersecting, and non-intersecting micro-wires 50 that can be used in the present invention.

Figure 7:
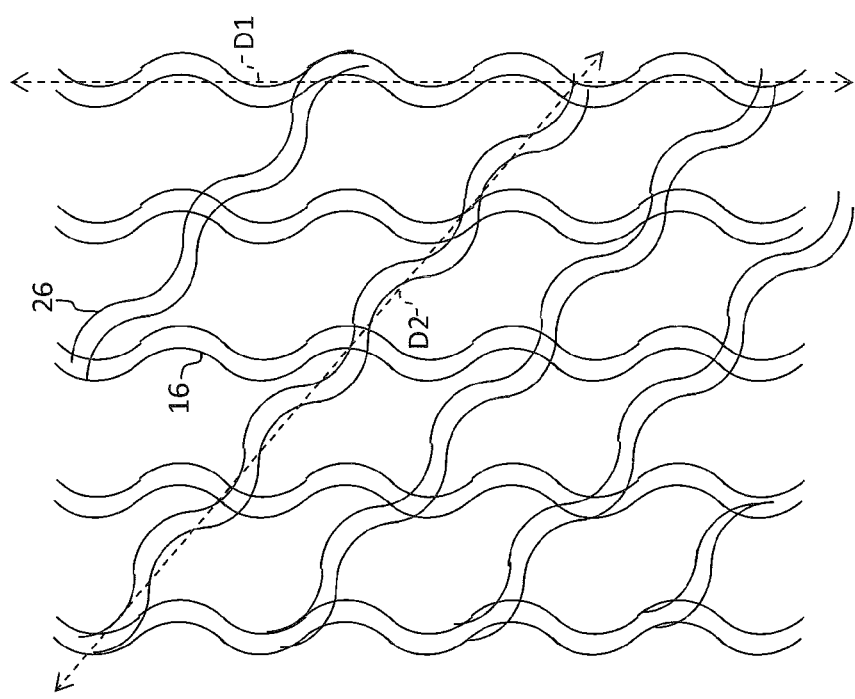

In other embodiments of the present invention and as shown in FIGS. 1-6, one or more of first, second, or third micro-wires 10, 20, 30 have substantially straight line segments. Furthermore, at least some first micro-wires 10 are substantially parallel or at least some second micro-wires 20 are substantially parallel. Alternatively, one or more of first or second micro-wires 10, 20 is curved. Referring to FIG. 7, curved first micro-wires 16 extending substantially in direction D1 intersect curved second micro-wires 26 extending substantially in direction D2 at an angle.

As is illustrated in the embodiment of FIG. 1, first and second micro-wires 10, 20 form an array of rectangles arranged in rows or columns, wherein adjacent rows or columns of rectangles are offset forming offset rectangles, for example as seen in a brick wall. Alternatively, as shown in FIG. 5, first and second micro-wires 10, 20 form a two-dimensional grid and an array of aligned rectangles having aligned horizontal edges in a common row and aligned vertical edges in a common column.

In a useful embodiment (e.g. as illustrated in FIG. 1), micro-wire pattern 55 forms rectangles having long sides at least four times longer than short sides so that the rectangles have an aspect ratio greater than or equal to four. In another embodiment, the spacing (distance L1) between at least two adjacent first micro-wires 10 is less than or equal to four times width W1 of at least one of first micro-wires 10. An electrically conductive micro-wire structure 5 having such an aspect ratio, a greater aspect ratio, or micro-wire pattern 55 with such a width to spacing ratio or greater is demonstrated to be manufacturable and to provide improved conductivity. Such micro-wire patterns 55 and electrically conductive micro-wire structures 5 have a transparency of 75% or less. In another embodiment, electrically conductive micro-wire structures 5 have a transparency of 70% or less. In yet another embodiment, electrically conductive micro-wire structures 5 have a transparency of 65% or less. In a further embodiment, electrically conductive micro-wire structures 5 have a transparency of 50% or less. In other embodiments, electrically conductive micro-wire structures 5 have a transparency of 40% or less. To at least some extent, the transparency of electrically conductive micro-wire structures 5 is dictated by the limitations of the manufacturing process employed. In general, according to embodiments of the present invention, it is useful to have an electrically conductive micro-wire structure 5 with a lower transparency rather than a higher transparency and a higher micro-wire 50 density rather than a lower micro-wire 50 density.

Figure 16:
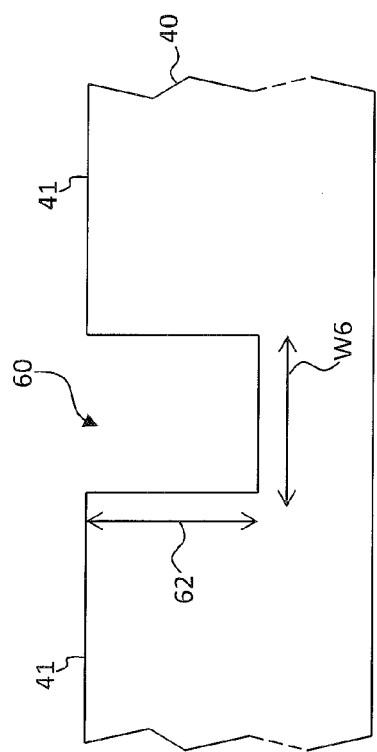
FIG. 16 is a cross section illustrating a rectangular micro-channel useful in the present invention.

Furthermore, since it is useful to form electrically conductive micro-wire structures 5 in a common step and with common materials with transparent micro-wire electrodes, it is useful to form micro-wires 50 that have a reduced width but an increased thickness 62, for example having a thickness 62 greater than a width, to provide increased conductivity and reduced width, thereby enhancing conductivity and transparency. As illustrated in FIG. 16, a micro-channel 60 formed in substrate 40 has a depth (thickness 62) from substrate surface 41 greater than a width W6. As illustrated in FIG. 17, a micro-wire 50 located or formed in micro-channel 60 of substrate 40 has a corresponding thickness 62 greater than a width W6. Such micro-wires, when made by a suitable method, can have a conductivity of less than or equal to 4 ohms per square, less than or equal to 3 ohms per square, less than or equal to 2 ohms per square, or less than or equal to 1 ohm per square. In other embodiments, one or more of first or second micro-wires 10, 20 has a width of greater than or equal to 0.5 μm and less than or equal to 20 μm to provide an apparently transparent micro-wire electrode (e.g. third micro-wires 30) whose micro-structure can also be used for first and second micro-wires 10, 20.

The cross section of micro-wire 50 can substantially form a rectangle, as shown in FIG. 17. Alternatively, referring to FIGS. 18 and 19, the cross section of micro-wire 50 can substantially form a trapezoid, whose base is closer to surface 41 of substrate 40 than the side of the trapezoid opposite the base (the trapezoid top). Referring to FIG. 18, trapezoidal micro-channel 61 formed in substrate 40 has a cross section with a trapezoid base having a width W8 and a side of the trapezoid opposite the base (the trapezoid top) having a width W7 less than width W8. As shown in FIG. 19, micro-wire 50 is formed or located in the trapezoidal micro-channel 61 of FIG. 18. A width of a micro-wire 50 formed in a trapezoidal micro-channel 61 can be either width W8 of the trapezoid base or width W7 of the trapezoid top or some combination, such as the average width. In another embodiment, the bottom of micro-channel 60 is curved, for example deeper in the center than at the edges.

Figure 20:
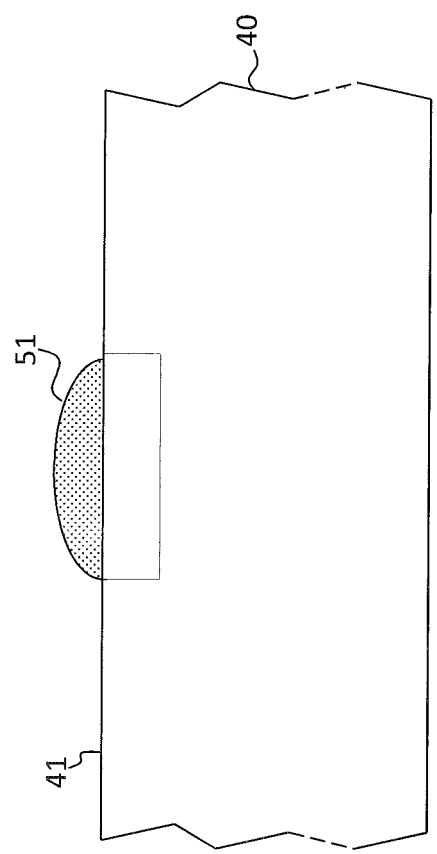
FIG. 20 is a cross section illustrating a micro-wire located on the surface of a substrate useful in the present invention.

According to various embodiments of the present invention and as illustrated in FIGS. 17 and 19, substrate 40 has a surface 41 below which a micro-wire 50 is located or formed in a micro-channel 60. Alternatively, referring to FIG. 20, one or more micro-wires 51 are located substantially on surface 41 of substrate 40.

Figure 21A:
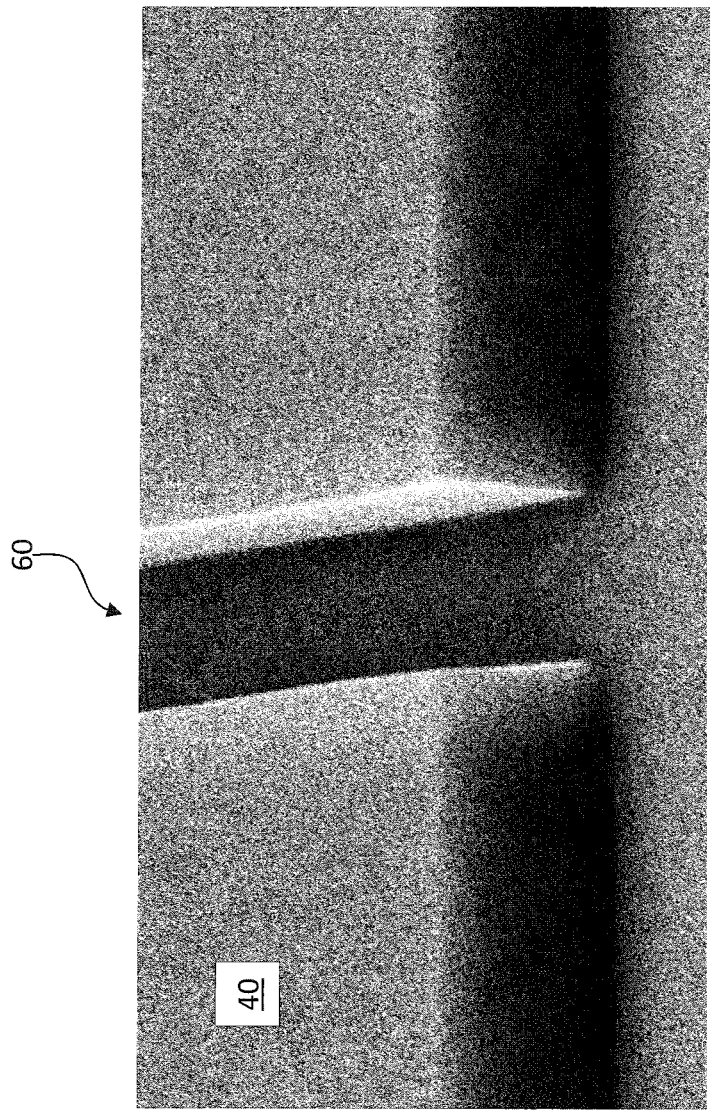
FIG. 21A is a representation of a perspective micrograph of micro-channels useful in the present invention.

A variety of methods can be used to make micro-wires 50 of electrically conductive micro-wire structure 5. Some of these methods are known in the prior art, for example as taught in CN102063951 and U.S. patent application Ser. No. 13/571,704 which are hereby incorporated by reference in their entirety. As discussed in CN102063951, a pattern of micro-channels 60 can be formed in a substrate using an embossing technique. Embossing methods are generally known in the prior art and typically include coating a curable liquid, such as a polymer, onto a rigid substrate. The polymer is partially cured (e.g. through heat or exposure to light or ultraviolet radiation) and then a pattern of micro-channels is embossed (impressed) onto the partially cured polymer layer by a master having a reverse pattern of ridges formed on its surface. The polymer is then completely cured. FIG. 21A illustrates a substrate 40 useful for the present invention having a pattern of 5μ-wide micro-channels 60 embossed therein. A conductive ink is then coated over substrate 40 and into micro-channels 60, the excess conductive ink between micro-channels 60 is removed, for example by mechanical buffing, patterned chemical electrolysis, or patterned chemical corrosion. The conductive ink in the micro-channels 60 is cured, for example by heating.

In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

Other methods can be employed Inkjet deposition of conductive inks is known in the art, as is printing conductive inks, for example using gravure offset printing, flexographic printing, pattern-wise exposing a photo-sensitive silver emulsion, or pattern-wise laser sintering a substrate 40 coated with conductive ink In an embodiment, a flexographic printing plate is formed using photolithographic techniques known in the art. Conductive ink is applied to the printing plate and then pattern-wise transferred to substrate 40. After patterned deposition, the conductive ink is cured.

Conductive inks including metallic particles are known in the art. In useful embodiments, the conductive inks include nano-particles, for example silver, in a carrier fluid such as an aqueous solution. The carrier fluid can include surfactants that reduce flocculation of the metal particles. Once deposited, the conductive inks are cured, for example by heating. The curing process drives out the solution and sinters the metal particles to form a metallic electrical conductor. In other embodiments, the conductive inks are powders that are pattern-wise transferred to a substrate and cured or are powders coated on a substrate and pattern-wise cured. Conductive inks are known in the art and are commercially available.

In any of these cases, conductive inks or other conducting materials are conductive after they are cured and any needed processing completed.

Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

Figure 21B:
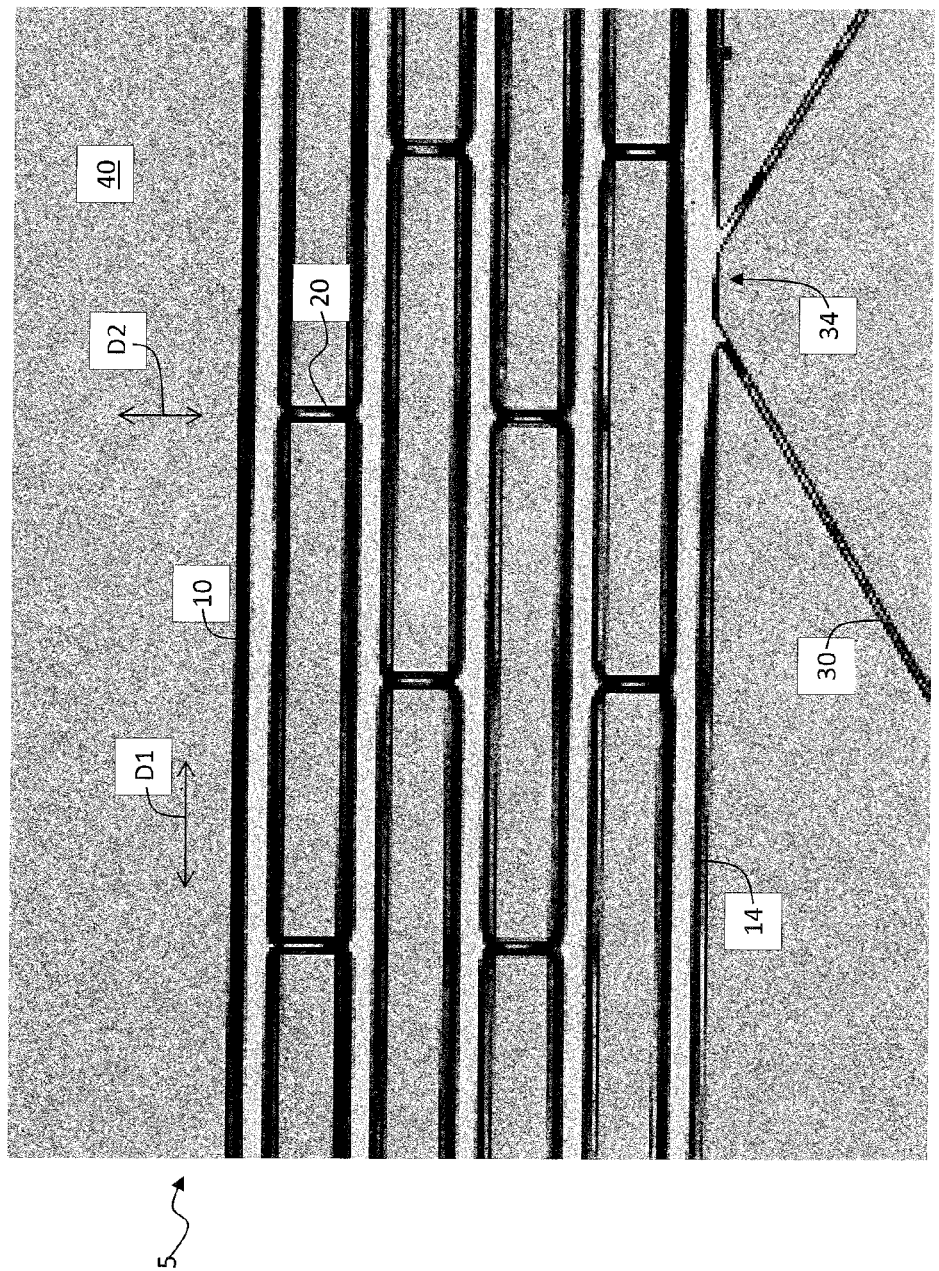
FIG. 21B is a representation of a top-view micrograph of an embodiment of the present invention.

FIG. 21B is a top view of an electrically conductive micro-wire structure 5 of the present invention formed using an emboss-and-fill method and having a substrate 40 with first micro-wires 10 extending in a first direction D1 across substrate 40 and second micro-wires 20 extending in a second direction D2 different from the first direction D1 across substrate 40. Each second micro-wire 20 is electrically connected to two first micro-wires 10. Third micro-wires 30 are electrically connected to a connection micro-wire 14 at connection locations 34.

Figure 27A:
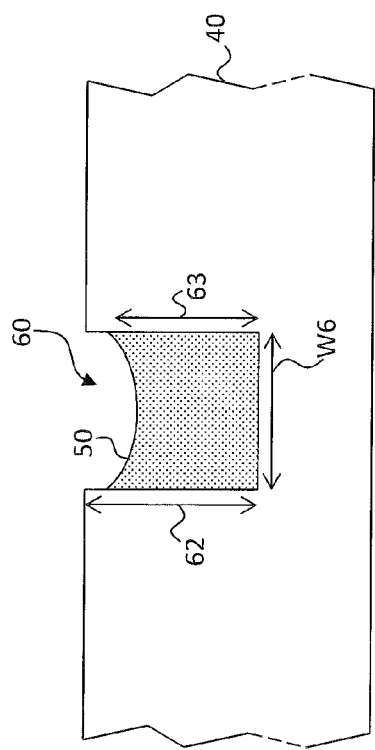
FIG. 27A is a cross section of a micro-channel useful in the present invention.

As described above with respect to FIG. 16, in emboss-and fill methods of the present invention a pattern of micro-channels 60 is created on a substrate 40 with each micro-channel 60 having a thickness 62. A conductive ink is then coated over substrate 40 and into micro-channels 60. The excess conductive ink between micro-channels 60 is removed, for example by using a squeegee. The conductive inks include nano-particles, for example silver, in a carrier fluid such as an aqueous solution. Typical weight concentrations of the silver nanoparticles range from 30% to 90%. Because of its high density, the volume concentration of silver in the solution is much lower, typically 4-50%. After filling micro-channels 60 with this conductive ink solution, the carrier fluid evaporates as illustrated in FIG. 27A, resulting in a silver micro-wire 50 in micro-channel 60 with a width W6 and a silver thickness 63 less than the thickness 62 of embossed micro-channel 50. The actual final silver thickness 63 of silver micro-wire 50 depends on the filling method and silver concentration in the conductive ink solution.

Figure 27B:
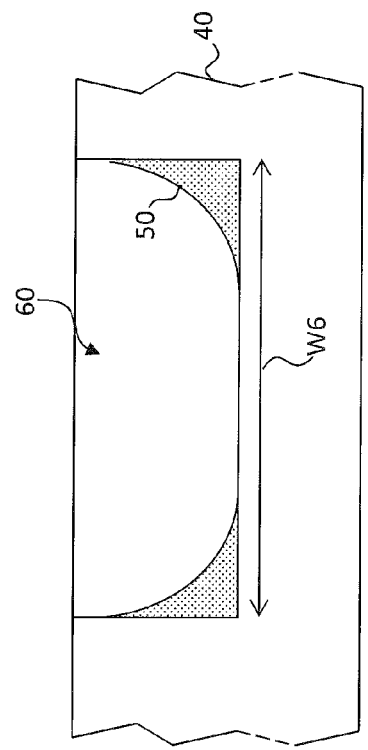
FIG. 27B is a cross section of a micro-channel useful in the present invention.

It has been demonstrated experimentally that the amount of silver remaining after drying is dependent on width W6 of micro-channel 60 in substrate 40. For micro-channel 60 widths W6 of 2-20 μm, the remaining silver fills micro-channel 60 as depicted in FIG. 27A. As width W6 of micro-channel 60 increases, silver thickness 63 of the remaining silver in micro-wire 50 at the middle of micro-channel 60 decreases. As a result, the sheet resistance of silver micro-wire 50 increases as width W6 of micro-channel 60 increases. Above a width W6 of approximately 20 μm, the silver micro-wire 50 cross section begins to look as illustrated in FIG. 27B. There is little or no silver in the center of micro-channel 60 in substrate 40 but with some silver at the sidewalls of the micro-channel 60. This effect substantially increases the resistance of the line and makes it more susceptible to defects.

Figure 22:
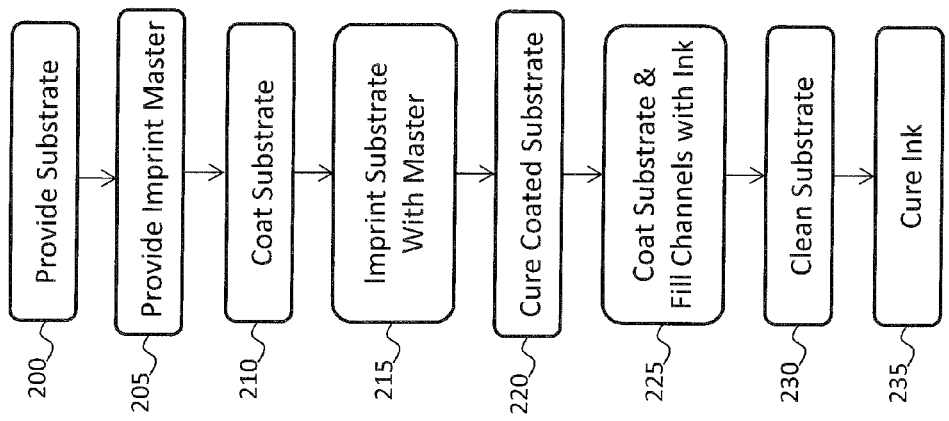

Referring to FIG. 22, in a method useful for making electrically conductive micro-wire structures 5 of the present invention, a substrate 40 is provided 200 and an imprint master is provided 205. Substrate 40 is coated 210, for example with a polymer and partially cured. The partially cured polymer coating is imprinted 215 with the print master and cured 220. Substrate 40 is coated 225 with a conductive ink, cleaned in step 230, and the remaining ink is cured.

Figure 23:
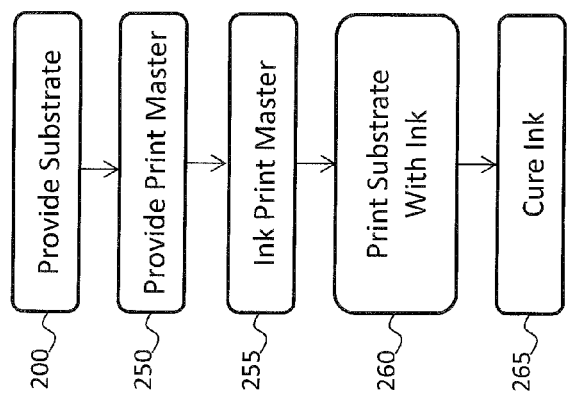
FIGS. 22-25 are flow charts illustrating various methods of making the present invention.

Referring to an alternative method illustrated in FIG. 23, a substrate 40 is provided 200 and a print master (e.g. a flexographic printing plate) is provided 250. The print master is inked 255 with conductive ink and the ink is pattern-wise printed 260 on substrate 40. The conductive ink is cured 265.

Figure 24:
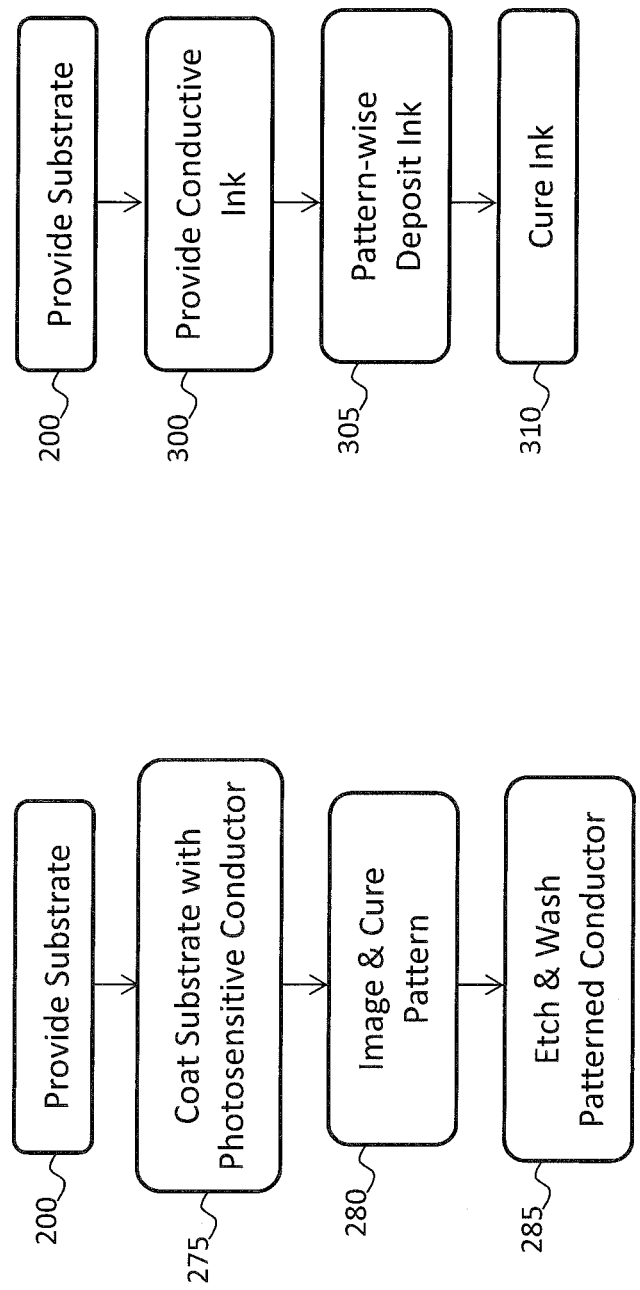

Referring to another alternative method illustrated in FIG. 24, a substrate 40 is provided 200 and coated 275 with a photosensitive conductor, for example a silver halide emulsion or a metal layer covered with a photo resist. The substrate 40 is exposed 280 to patterned radiation, for example with a laser or with electromagnetic radiation through a mask. The patterned photosensitive conductor is then cured if necessary, e.g. by fixing, and unwanted photosensitive conductor material removed 285 by etching or washing.

Figure 25:
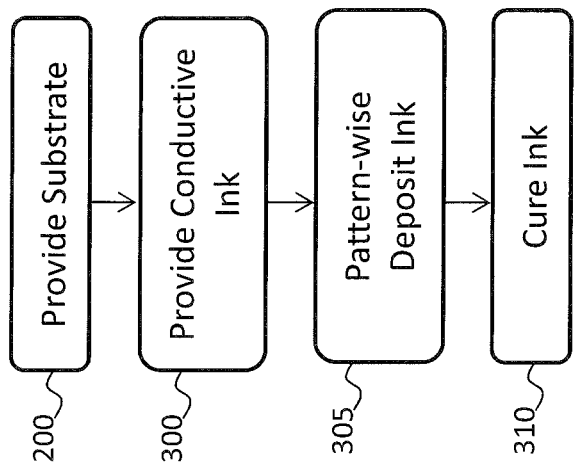
Figure 26:
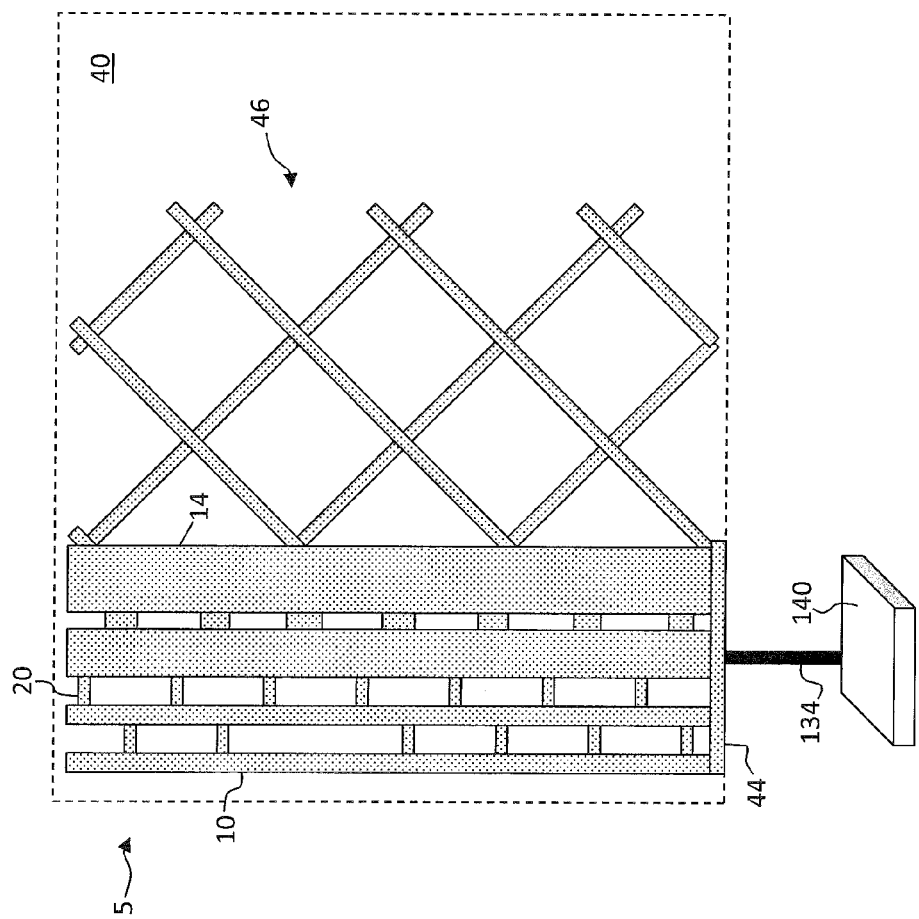
FIG. 26 is a schematic illustrating an embodiment of the present invention in an electronic system.

In yet another alternative method illustrated in FIG. 25, a substrate 40 is provided 200 and a conductive ink provided 300. The conductive ink is pattern-wise deposited 305 on substrate 40, for example using an inkjet apparatus, and the conductive ink is cured 310. Electrically conductive micro-wire structure 5 of the present invention can be employed in electronic devices to conduct electricity across a substrate 40. For example, referring to FIG. 26, electrically conductive micro-wire structure 5 can be electrically connected to a transparent micro-wire electrode 46 (e.g. formed from third micro-wires 30 in FIGS. 8 and 9) formed on substrate 40 through an electrical connector 44 and wires 134 to touch-screen controller 140 in a touch-screen device. Signals from touch-screen controller 140 pass through conventional wires 134 in electrical contact with electrical connector 44 to electrically conductive micro-wire structure 5. Electrically conductive micro-wire structure 5 conducts electrical signals to and from transparent micro-wire electrodes 46 to operate the touch-screen device. Electricity preferentially passes in the preferred direction of the length of first micro-wires 10 in electrically conductive micro-wire structure 5 and preferentially passes through connection micro-wire 14 and the wider first and second micro-wires 10, 20. In the event of manufacturing defects in first micro-wires 10, second micro-wires 20 provide alternative conduction paths for electricity, thereby providing robustness to electrically conductive micro-wire structure 5.

Substrate 40 of the present invention can include any material capable of providing a supporting surface on which micro-wires 50 can be formed and patterned. Substrates such as glass, metal, or plastic can be used and are known in the art together with methods for providing suitable surfaces. In a useful embodiment, substrate 40 is substantially transparent, for example having a transparency of greater than 90%, 80% 70% or 50% in the visible range of electromagnetic radiation.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Micro-wires 50 can be a thin metal layer composed of highly conductive metals such as gold, silver, copper, or aluminum. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition or pattern-wise formation followed by curing steps. Other materials or methods for forming micro-wires 50 can be employed and are included in the present invention.

Micro-wires 50 can be, but need not be, opaque. Micro-wires 50 can be formed by patterned deposition of conductive materials or of patterned precursor materials that are subsequently processed, if necessary, to form a conductive material. Suitable methods and materials are known in the art, for example inkjet deposition or screen printing with conductive inks. Alternatively, micro-wires 50 can be formed by providing a blanket deposition of a conductive or precursor material and patterning and curing, if necessary, the deposited material to form a micro-wire pattern 55 of micro-wires 50. Photolithographic and photographic methods are known to perform such processing. The present invention is not limited by the micro-wire materials or by methods of forming a micro-wire pattern 55 of micro-wires 50 on a supporting substrate surface.

Commonly-assigned U.S. patent application Ser. No. 13/406,649 discloses a variety of materials and methods for forming patterned micro-wires on a substrate surface.

In various embodiments, micro-wires 50 in electrically conductive micro-wire structure 5 are formed in a micro-wire layer that forms a conductive mesh of electrically connected micro-wires 50. If substrate 40 on or in which micro-wires 50 are formed is planar, for example, a rigid planar substrate such as a glass substrate, micro-wires 50 in a micro-wire layer are formed in, or on, a common plane as a conductive, electrically connected mesh forming electrically conductive micro-wire structure 5. If substrate 40 is flexible and curved, for example a plastic substrate, micro-wires 50 in a micro-wire layer are a conductive, electrically connected mesh that is a common distance from a surface 41 of flexible substrate 40.

Micro-wires 50 can be formed directly on substrate 40 or over substrate 40 on layers formed on substrate 40. The words "on", "over", or the phrase "on or over" indicate that micro-wires 50 of the electrically conductive micro-wire structure 5 of the present invention can be formed directly on a surface 41 of substrate 40, on layers formed on substrate 40, or on either or both of opposing sides of substrate 40. Thus, micro-wires 50 of the electrically conductive micro-wire structure 5 of the present invention can be formed under or beneath substrate 40. "Over" or "under", as used in the present disclosure, are simply relative terms for layers located on or adjacent to opposing surfaces of a substrate 40. By flipping substrate 40 and related structures over, layers that are over substrate 40 become under substrate 40 and layers that are under substrate 40 become over substrate 40.

Micro-wires 50 of electrically conductive micro-wire structure 5 of the present invention can form an electrode that conducts electricity better in one direction (in this case, first direction D1, FIG. 1) than in another conductive direction, for example across the width of electrically conductive micro-wire structure 5 (D2) or than in another conductive direction that is not the length direction of first micro-wires 10. Electrically conductive micro-wire structure 5 conducts electricity better in the length direction of first micro-wires 10 because the conductive path is shorter per linear dimension in the length direction of first micro-wires 10 and, in some embodiments, because micro-wires 50 are wider in a dimension orthogonal to the length direction, for example as measured in ohms per centimeter.

The length direction of electrically conductive micro-wire structure 5 (e.g. first direction D1) is typically the direction of the greatest spatial extent of electrically conductive micro-wire structure 5 over substrate 40 on which electrically conductive micro-wire structure 5 is formed. Electrically conductive micro-wire structures 5 formed on or over substrates 40 are typically rectangular in shape, or formed of rectangular elements, with a length and a width, and the length is much greater than the width. In any case, the length direction can be selected to be a direction of desired greatest conductance of electrically conductive micro-wire structure 5. Electrically conductive micro-wire structure 5 are generally used to conduct electricity from a first point on substrate 40 to a second point on substrate 40 and the direction of electrically conductive micro-wire structure 5 from the first point to the second point can be the length direction.

A variety of micro-wire patterns 55 can be used according to various embodiments of the present invention. Micro-wires 50 can be formed at the same or different angles to each other, can cross over or intersect each other, can be parallel, can have different lengths, or can have replicated portions or patterns. Some or all of micro-wires 50 can be curved or straight and can form line segments in a variety of patterns. Micro-wires 50 can be formed on opposing sides of the same substrate 40 or on facing sides of separate substrates 40 or some combination of those arrangements. Such embodiments are included in the present invention.

In an example and non-limiting embodiment of the present invention, each micro-wire 50 is from 5 microns wide to one micron wide and is separated from neighboring micro-wires 50 by a distance of 20 microns or less, for example 10 microns, 5 microns, 2 microns, or one micron.

Methods and device for forming and providing substrates, coating substrates, patterning coated substrates, or patternwise depositing materials on a substrate are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. These tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

Parts List

D1 first direction
D2 second direction
W1 width
W2 width
W3 width
W4 width
W5 width
W6 width
W7 width
W8 width
L1 distance
L2 distance
L3 distance
L4 distance
L5 distance
5 electrically conductive micro-wire structure
10 first micro-wire
11 first micro-wire
12 first micro-wire
14 connection micro-wire
16 curved first micro-wire
20 second micro-wire
21 second micro-wire
22 second micro-wire
23 second micro-wire
24 second micro-wire
25 angled second micro-wire
26 curved second micro-wire
30 third micro-wire
34 connection location
40 substrate
41 substrate surface
44 electrical connector
46 transparent micro-wire electrode
50 micro-wire
51 micro-wire
55 micro-wire pattern
60 micro-channel
61 trapezoidal micro-channel
62 thickness
63 silver thickness
100 touch screen and display system
110 display 111 display area
120 touch screen
122 first transparent substrate
124 transparent dielectric layer
126 second transparent substrate
128 first pad area
129 second pad area
130 first transparent electrode
132 second transparent electrode
134 wires
136 electrical buss
140 touch-screen controller
142 display controller
150 micro-wire
156 micro-pattern
200 provide substrate step
205 provide imprint master step
210 coat substrate step
215 imprint substrate with master step
220 cure coated substrate step
225 coat substrate and fill channels with ink step
230 clean substrate step
235 cure ink step
250 provide print master step
255 ink print master step
260 print substrate with ink step
265 cure ink step
275 coat substrate with photosensitive conductor step
280 image & cure pattern step
285 etch and wash patterned conductor step
300 provide conductive ink step
305 pattern-wise deposit ink step
310 cure ink step

The invention claimed is:

1. A conductive micro-wire structure, comprising:
   a substrate;
   a plurality of spaced-apart electrically connected micro-wires formed on or in the substrate; and
   wherein the conductive micro-wire structure has a transparency of less than 75% and greater than 0%.

2. The conductive micro-wire structure of claim 1, wherein the conductive micro-wire structure has a transparency of less than 70%.

3. The conductive micro-wire structure of claim 2, wherein the conductive micro-wire structure has a transparency of less than or equal to 65%.

4. The conductive micro-wire structure of claim 3, wherein the conductive micro-wire structure has a transparency of less than or equal to 50%.

5. The conductive micro-wire structure of claim 4, wherein the conductive micro-wire structure has a transparency of less than or equal to 40%.

6. The conductive micro-wire structure of claim 1, wherein the micro-wire conductor has a conductance of less than or equal to 4 ohms per square.

7. The conductive micro-wire structure of claim 6, wherein the micro-wire conductor has a conductance of less than or equal to 3 ohms per square.

8. The conductive micro-wire structure of claim 7, wherein the micro-wire conductor has a conductance of less than or equal to 2 ohms per square.

9. The conductive micro-wire structure of claim 8, wherein the micro-wire conductor has a conductance of less than or equal to 1 ohm per square.

10. The conductive micro-wire structure of claim 1, wherein at least one of the micro-wires has a width of less than or equal to 4 microns.

11. The conductive micro-wire structure of claim 10, wherein at least one of the micro-wires has a width of less than or equal to 3 microns.

12. The conductive micro-wire structure of claim 11, wherein at least one of the micro-wires has a width of less than or equal to 2 microns.

13. The conductive micro-wire structure of claim 1, wherein the spaced-apart electrically connected micro-wires include:
   a plurality of spaced-apart first micro-wires extending across the substrate in a first direction;
   a plurality of spaced-apart second micro-wires extending across the substrate in a second direction different from the first direction, each second micro-wire electrically connected to at least two first micro-wires.

14. The conductive micro-wire structure of claim 13, wherein at least one of the first micro-wires has a width greater than the width of at least one of the second micro-wires.

15. The conductive micro-wire structure of claim 13, wherein two adjacent pairs of first micro-wires are spaced apart by a distance greater than the distance spacing apart two adjacent second micro-wires.

16. The conductive micro-wire structure of claim 13, wherein at least one of the first micro-wires has a length greater than the length of at least one of the second micro-wires.

17. The conductive micro-wire structure of claim 1, wherein at least one of the micro-wires has a thickness greater than width.

18. The conductive micro-wire structure of claim 1, further comprising micro-channels formed in the substrate and the micro-wires are located in the micro-channels.

19. The conductive micro-wire structure of claim 18, wherein a cross section of one or more of the channels substantially forms a rectangle or a trapezoid.

20. The conductive micro-wire structure of claim 1, wherein the substrate has a surface and wherein the micro-wires are formed substantially on the surface.

21. The conductive micro-wire structure of claim 1, wherein at least one of the micro-wires is a connection micro-wire that is wider than at least some of the other micro-wires.

22. The conductive micro-wire structure of claim 21, wherein at least one of the micro-wires that is closer to the connection micro-wire is wider than at least one of the other micro-wires that is farther from the connection micro-wire.

23. The conductive micro-wire structure of claim 21, wherein at least two of the micro-wires closer to the connection micro-wire are more closely spaced than at least two of the micro-wires that are farther from the connection micro-wire.

24. The conductive micro-wire structure of claim 13, wherein adjacent first micro-wires are equally spaced apart or the adjacent second micro-wires are equally spaced apart.

25. The conductive micro-wire structure of claim 13, wherein one or more of the second micro-wires is electrically connected to only two adjacent first micro-wires.

26. The conductive micro-wire structure of claim 1, wherein one or more of the micro-wires has straight line segments.

27. The conductive micro-wire structure of claim 1, wherein the micro-wires form an array of aligned or offset rectangles having an aspect ratio greater than four.

\* \* \* \* \*